United States Patent
Toh et al.

(10) Patent No.: US 9,620,642 B2
(45) Date of Patent: Apr. 11, 2017

(54) FINFET WITH ISOLATION

(71) Applicant: GLOBALFOUNDRIES Singapore Pte. Ltd., Singapore (SG)

(72) Inventors: Eng Huat Toh, Singapore (SG); Shyue Seng Tan, Singapore (SG); Elgin Kiok Boone Quek, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 238 days.

(21) Appl. No.: 14/103,780

(22) Filed: Dec. 11, 2013

(65) Prior Publication Data
US 2015/0162436 A1   Jun. 11, 2015

(51) Int. Cl.
*H01L 29/78*   (2006.01)
*H01L 29/66*   (2006.01)
*H01L 21/762*  (2006.01)

(52) U.S. Cl.
CPC ...... *H01L 29/785* (2013.01); *H01L 21/76205* (2013.01); *H01L 29/66545* (2013.01); *H01L 29/66795* (2013.01); *H01L 29/7851* (2013.01); *H01L 2221/1047* (2013.01)

(58) Field of Classification Search
CPC ......... H01L 29/66545; H01L 29/66795; H01L 29/785; H01L 29/7851; H01L 21/76205; H01L 2221/1047
See application file for complete search history.

(56) References Cited

U.S. PATENT DOCUMENTS

| | | | | |
|---|---|---|---|---|
| 8,785,284 B1* | 7/2014 | Bergendahl | ....... | H01L 21/76205 438/296 |
| 2001/0049167 A1* | 12/2001 | Madson | ........... | H01L 21/82348 438/212 |
| 2002/0025638 A1* | 2/2002 | Yeh | .................. | H01L 29/66545 438/299 |
| 2008/0001171 A1* | 1/2008 | Tezuka | ............. | H01L 21/82380 257/191 |
| 2009/0140345 A1* | 6/2009 | Zhu | ..................... | H01L 21/3141 257/369 |
| 2009/0278196 A1* | 11/2009 | Chang | .............. | H01L 21/82341 257/328 |
| 2010/0052073 A1* | 3/2010 | Taya | ................. | H01L 21/82385 257/392 |

(Continued)

OTHER PUBLICATIONS

Biermann, E., et al. Oxide growth enhancement on highly n-type doped silicon under steam oxidation. J. Electrochem. Soc., 143(4), (1996), 1434-1442.*

*Primary Examiner* — Lex Malsawma
*Assistant Examiner* — Gardner W Swan
(74) *Attorney, Agent, or Firm* — Horizon IP Pte. Ltd.

(57) ABSTRACT

Devices and methods for forming a device are presented. The method includes providing a substrate prepared with a device region. A fin is formed in the device region. The fin includes top and bottom portions. An isolation layer is formed on the substrate. The isolation layer has a top isolation surface disposed below a top fin surface, leaving an upper fin portion exposed. At least one isolation buffer is formed in the bottom fin portion, leaving the top fin portion crystalline, the top fin portion serves as a body of a fin type transistor. Source/drain (S/D) regions are formed in the top portions of the fin and a gate wrapping around the fin is provided.

19 Claims, 21 Drawing Sheets

(56) References Cited

U.S. PATENT DOCUMENTS

| | | | |
|---|---|---|---|
| 2010/0144121 A1* | 6/2010 | Chang | H01L 29/7851 438/478 |
| 2010/0163970 A1* | 7/2010 | Rakshit | H01L 29/785 257/327 |
| 2010/0163971 A1* | 7/2010 | Hung | H01L 29/785 257/327 |
| 2011/0198676 A1* | 8/2011 | Luo | H01L 29/7851 257/288 |
| 2011/0298050 A1* | 12/2011 | Luo | H01L 29/7851 257/347 |
| 2011/0316080 A1* | 12/2011 | Luo | H01L 29/7851 257/347 |
| 2013/0316513 A1* | 11/2013 | Basker | H01L 27/1211 438/400 |
| 2014/0061862 A1* | 3/2014 | Vega | H01L 21/3081 257/616 |
| 2014/0175561 A1* | 6/2014 | Colinge | H01L 29/785 257/401 |
| 2015/0102409 A1* | 4/2015 | Cheng | H01L 21/845 257/347 |
| 2015/0102411 A1* | 4/2015 | Ching | H01L 21/76205 257/347 |
| 2015/0221761 A1* | 8/2015 | Tan | H01L 29/785 257/347 |

\* cited by examiner

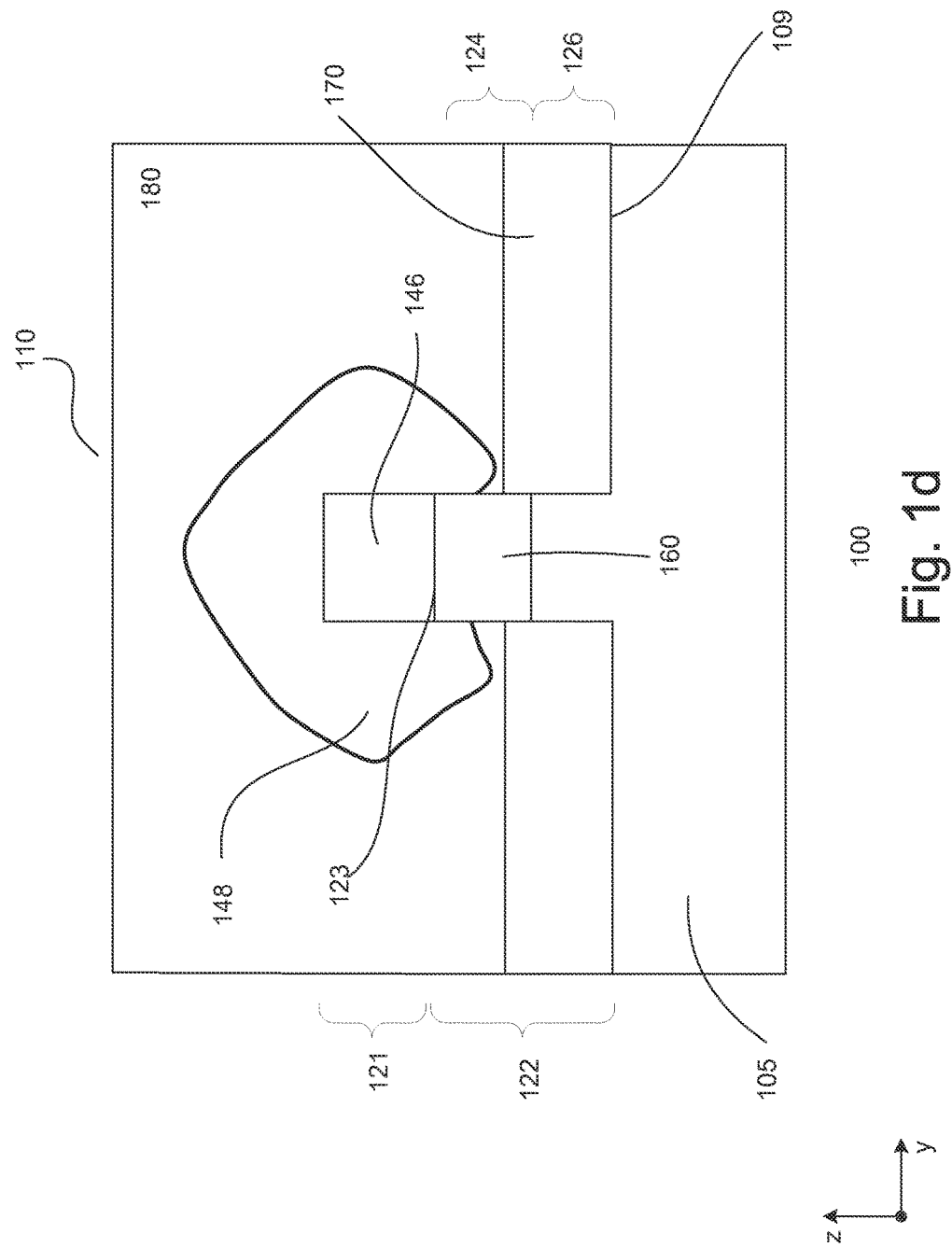

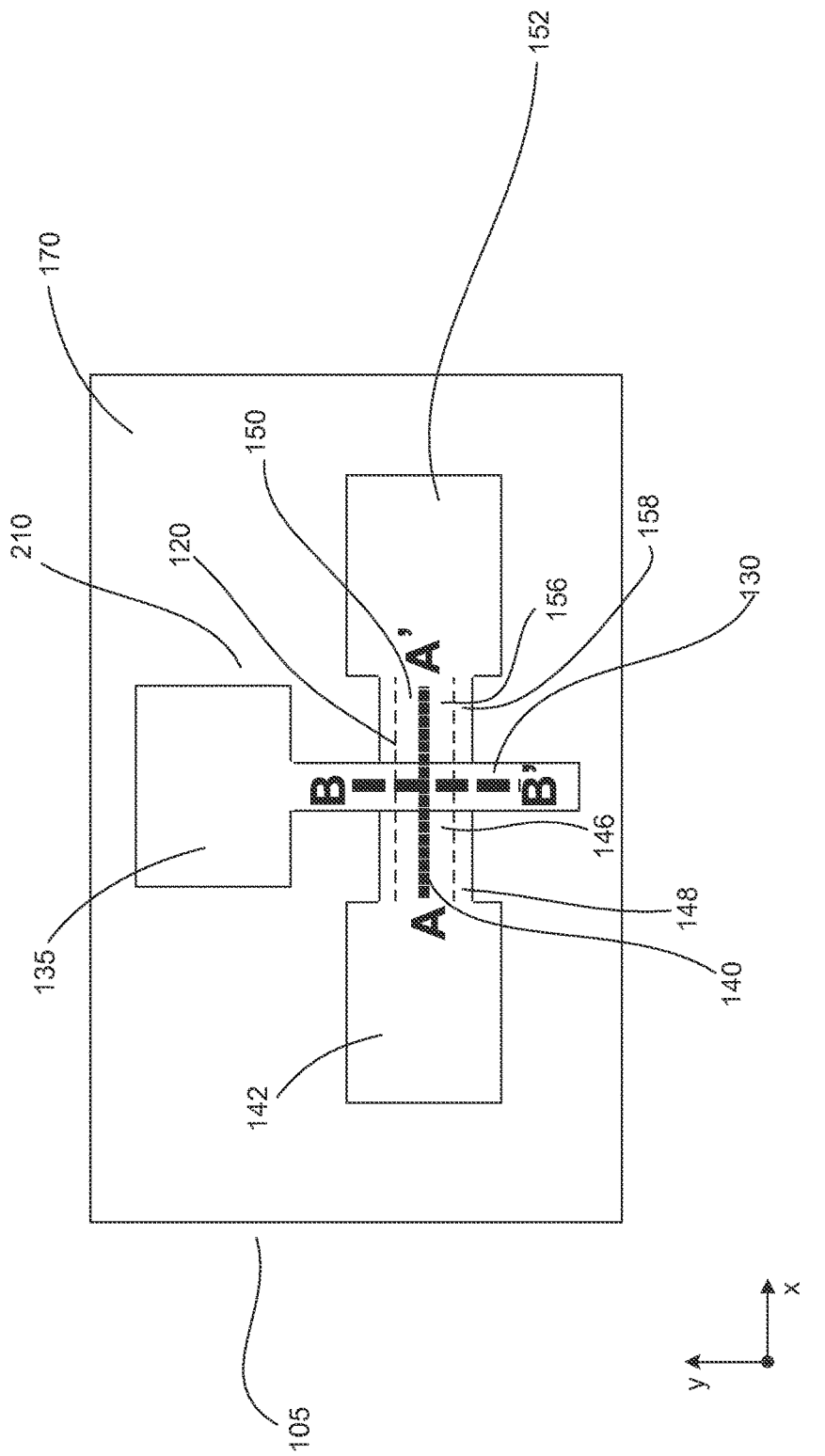

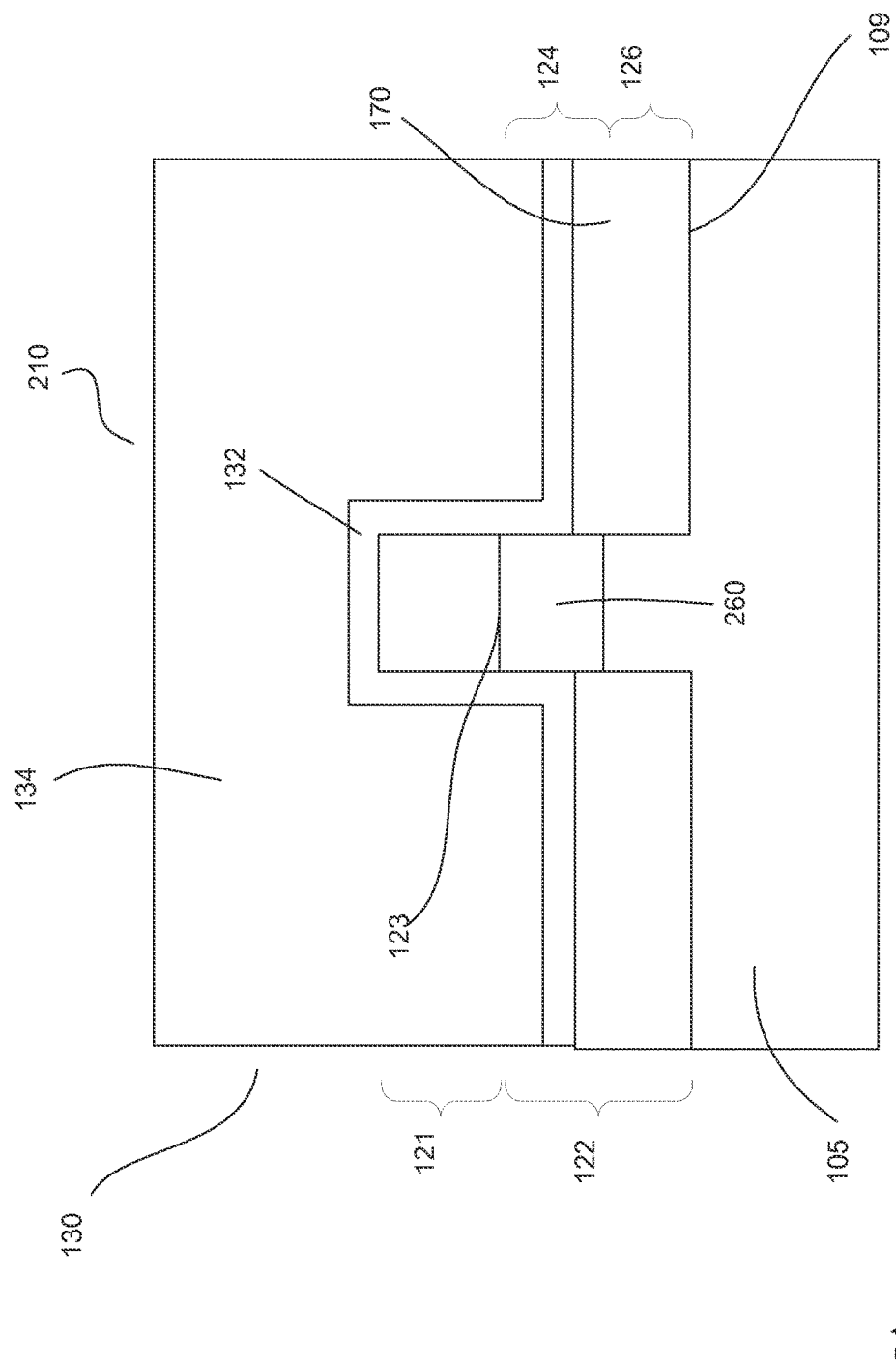

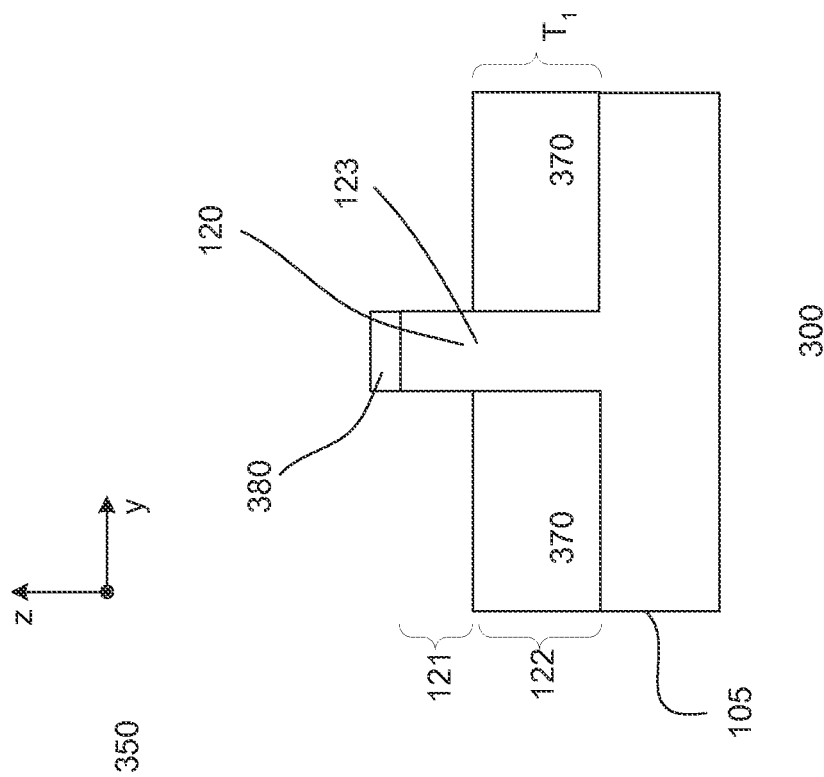
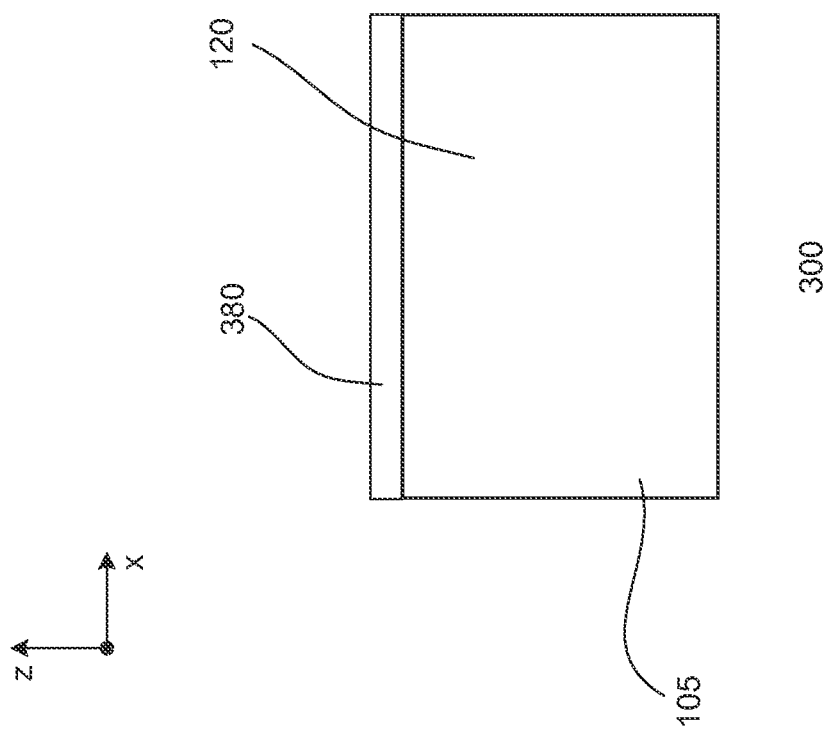
Fig. 3a₁
Fig. 3a₂

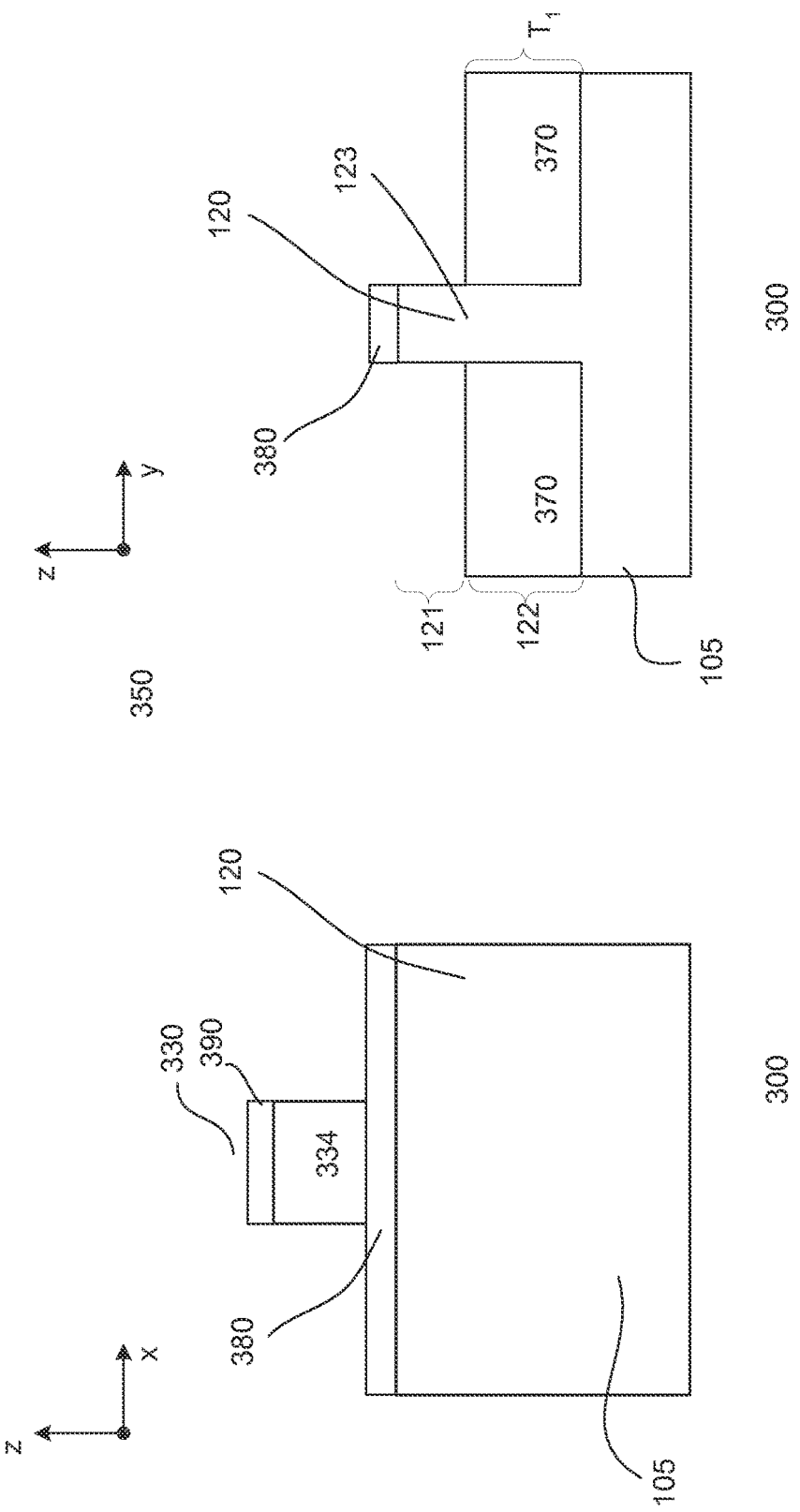

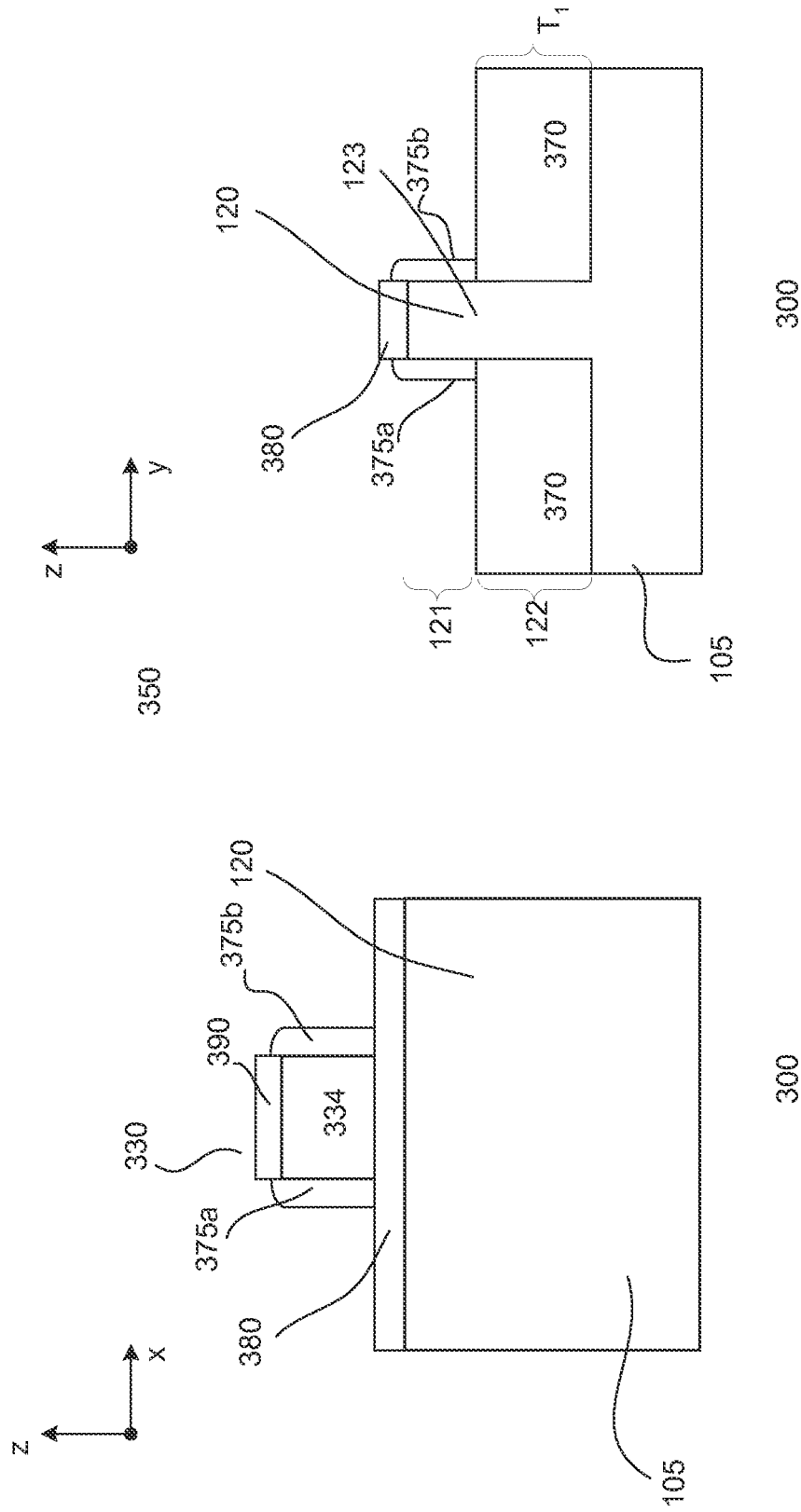

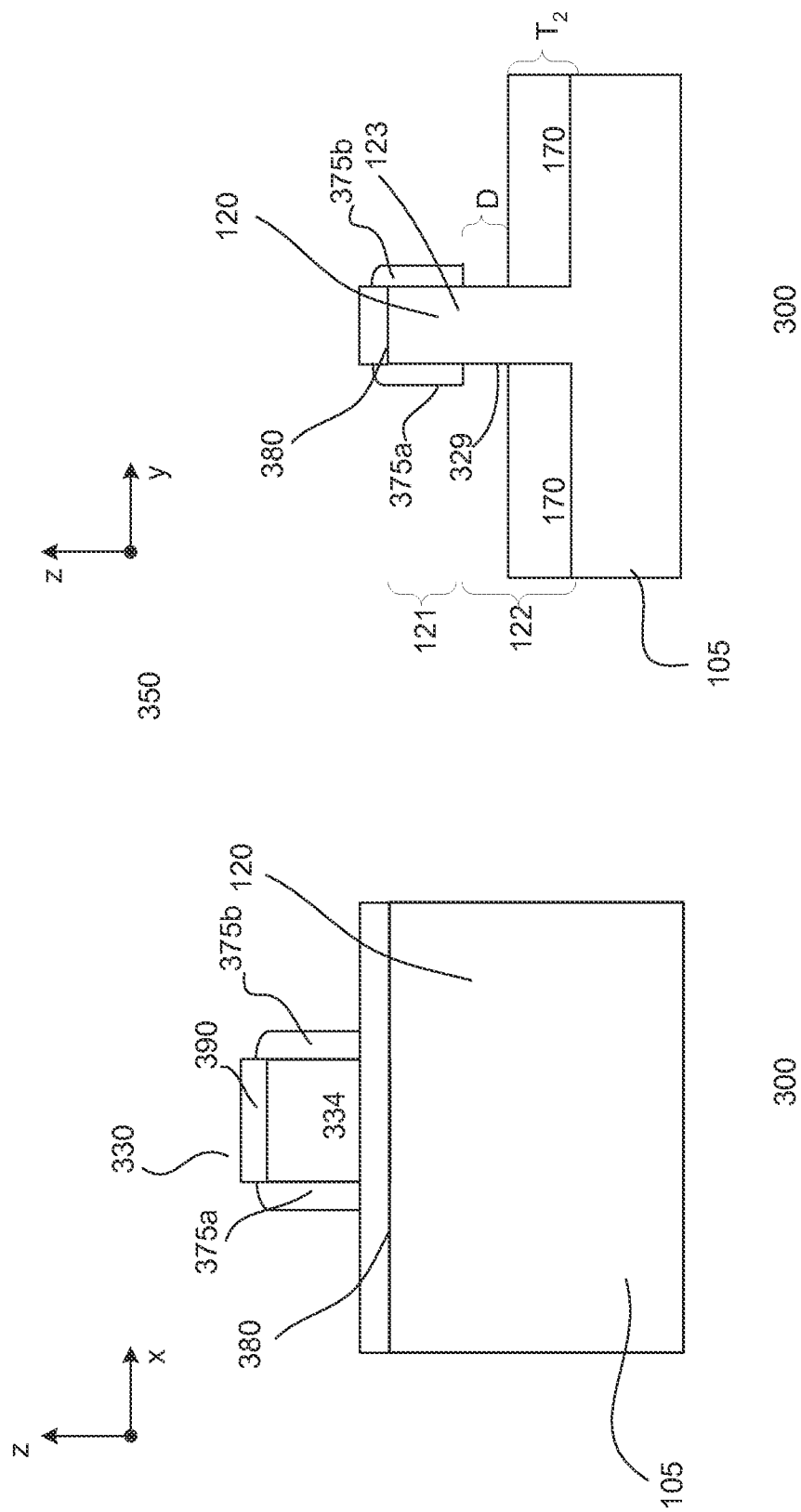

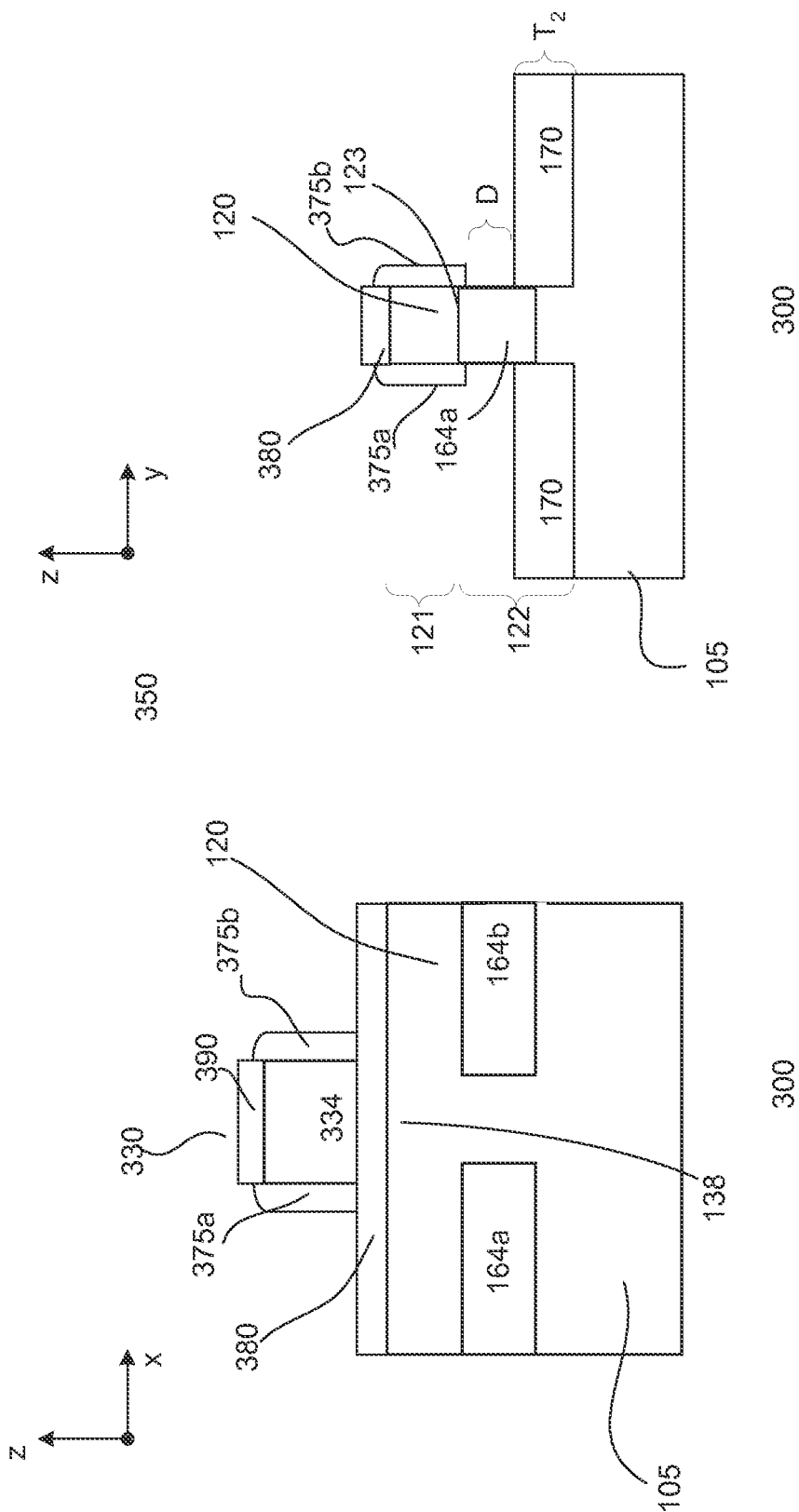

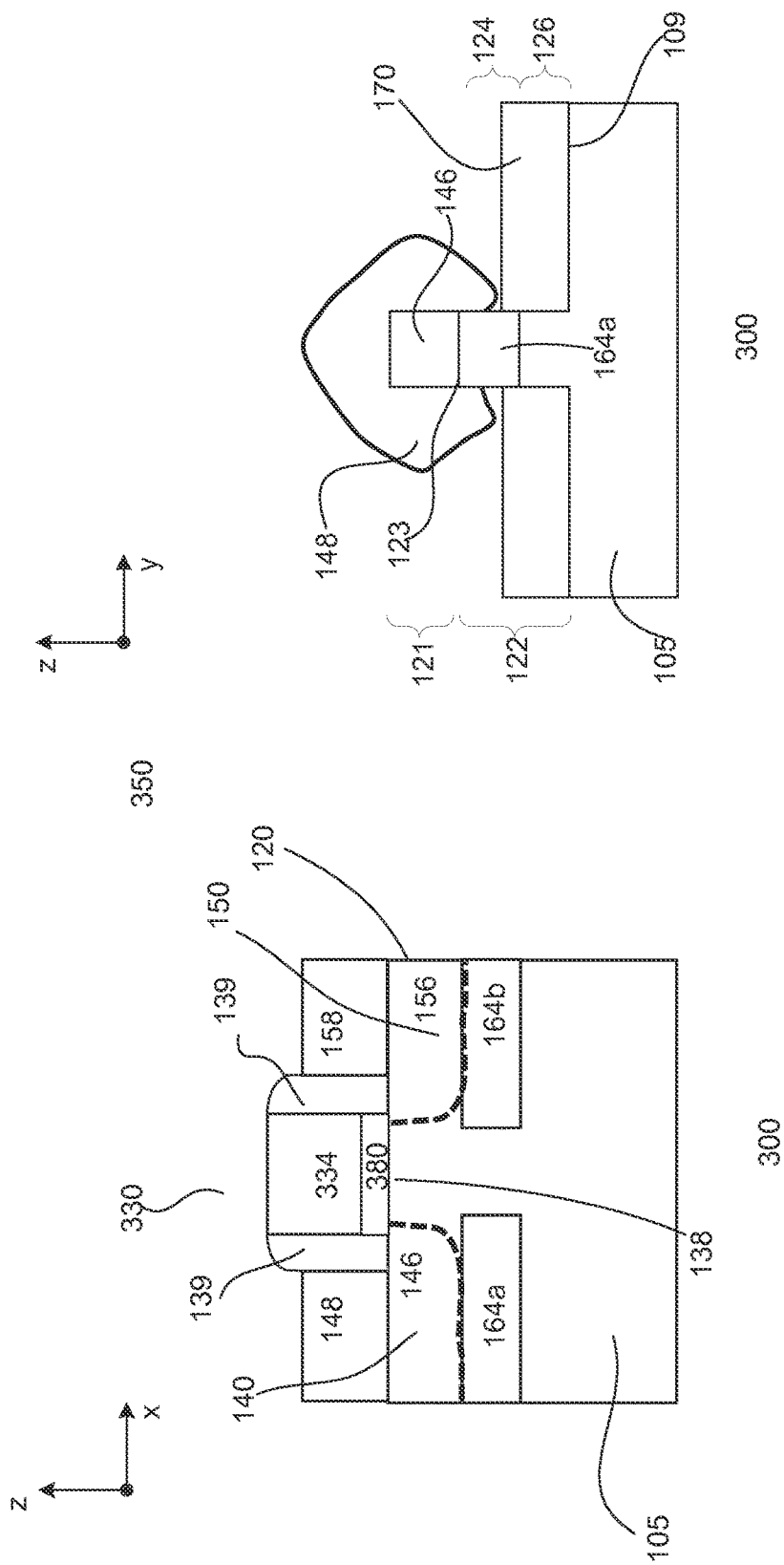

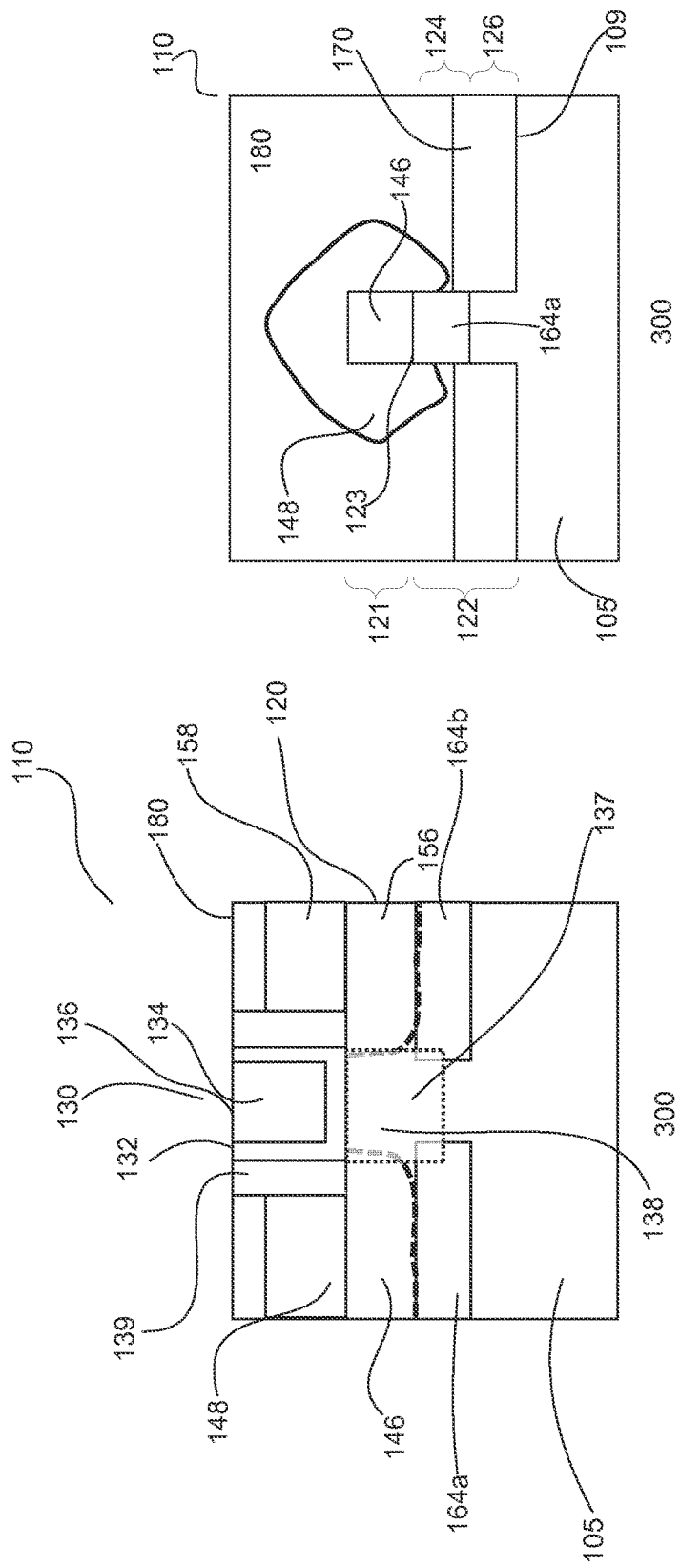

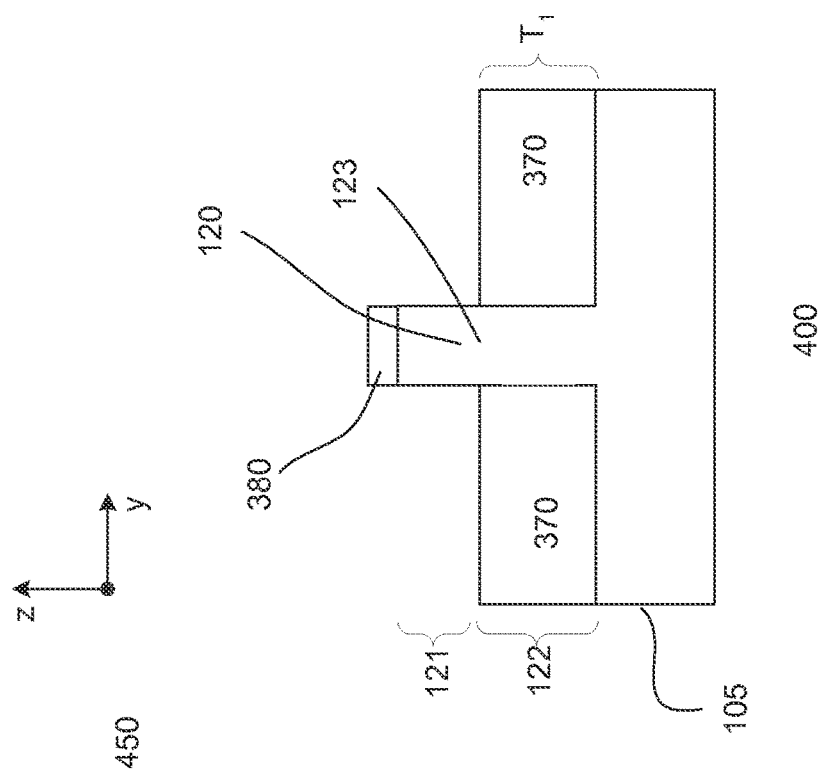
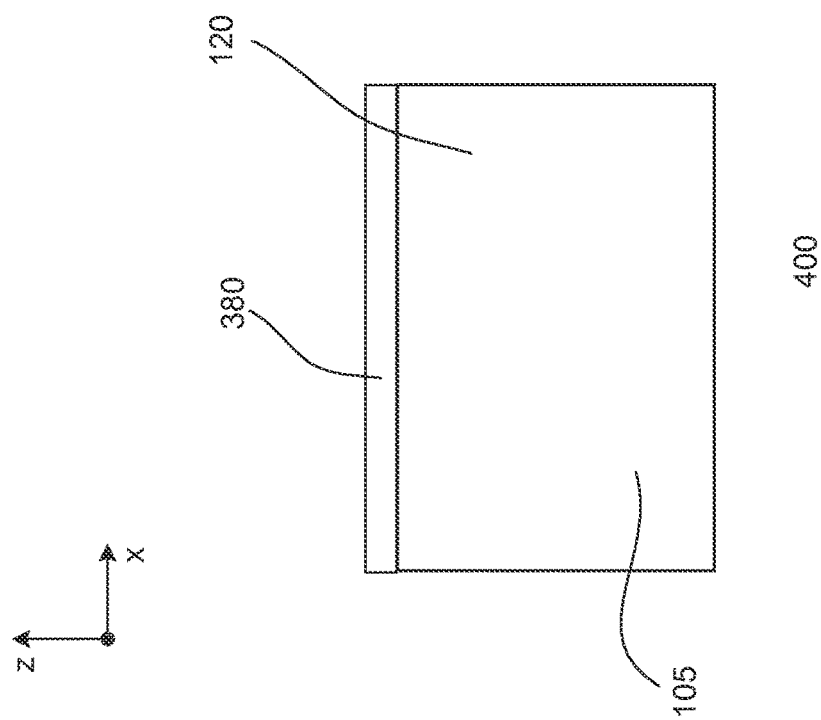

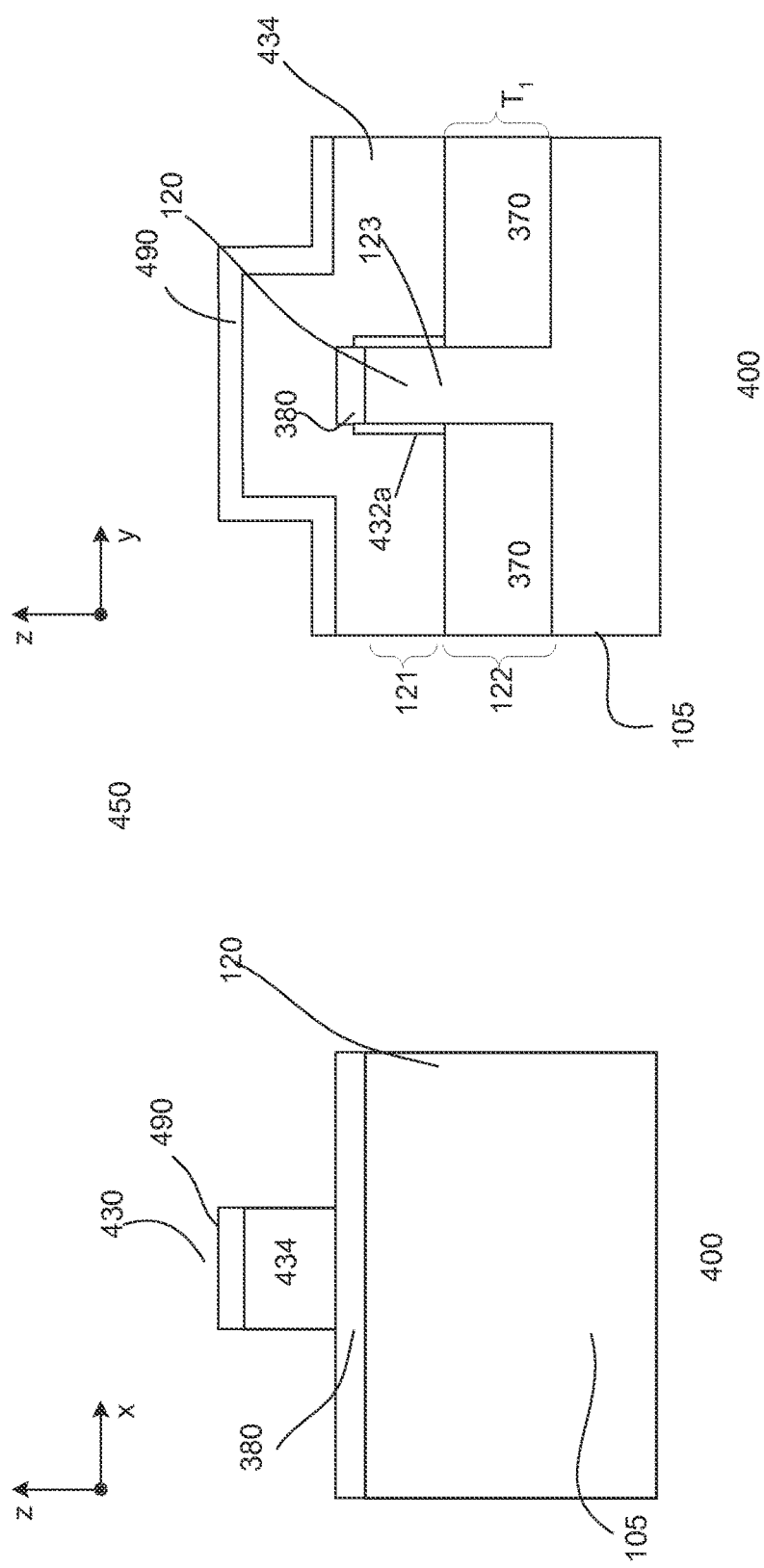

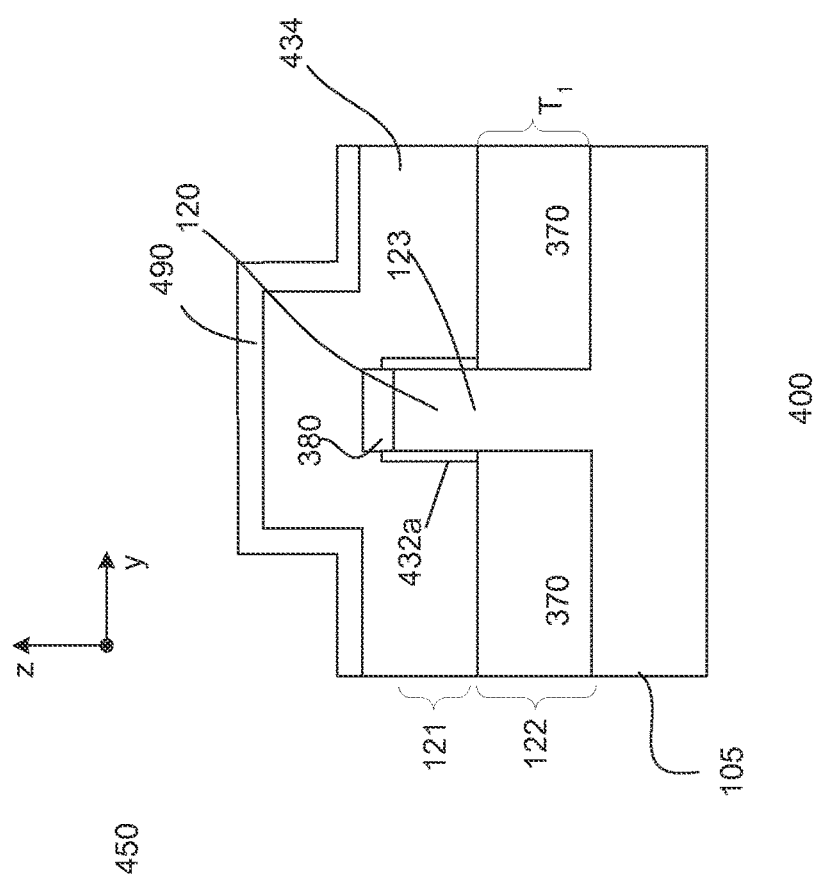
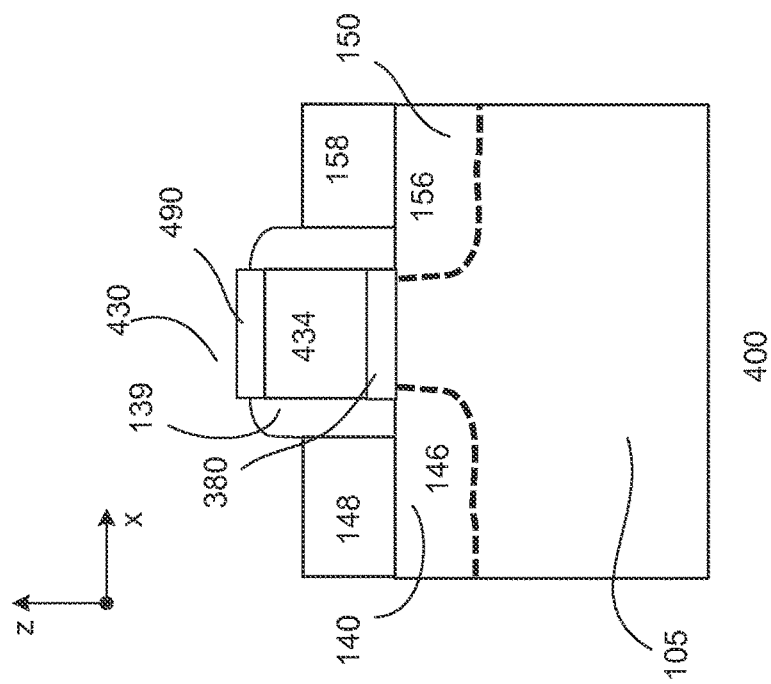

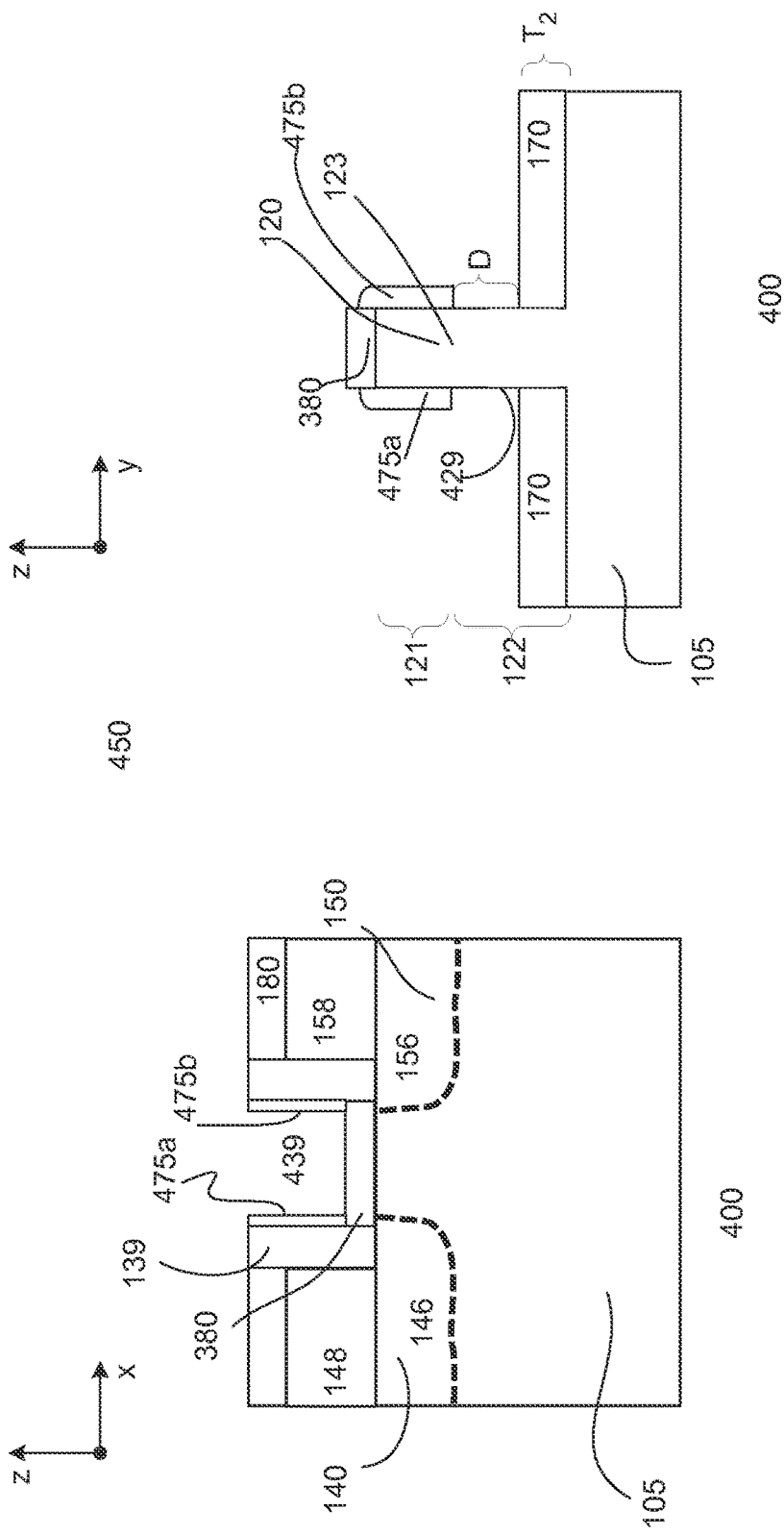

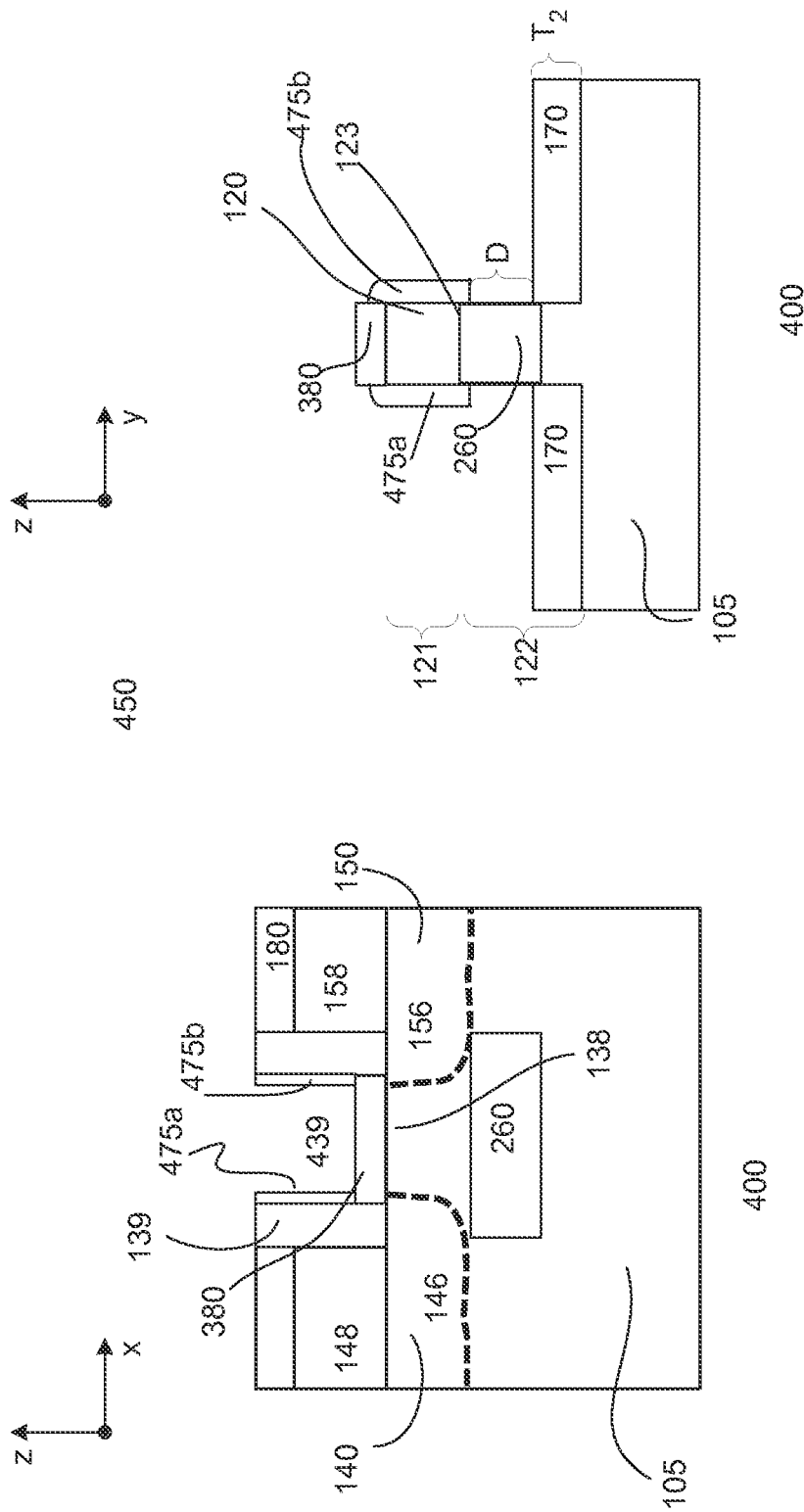

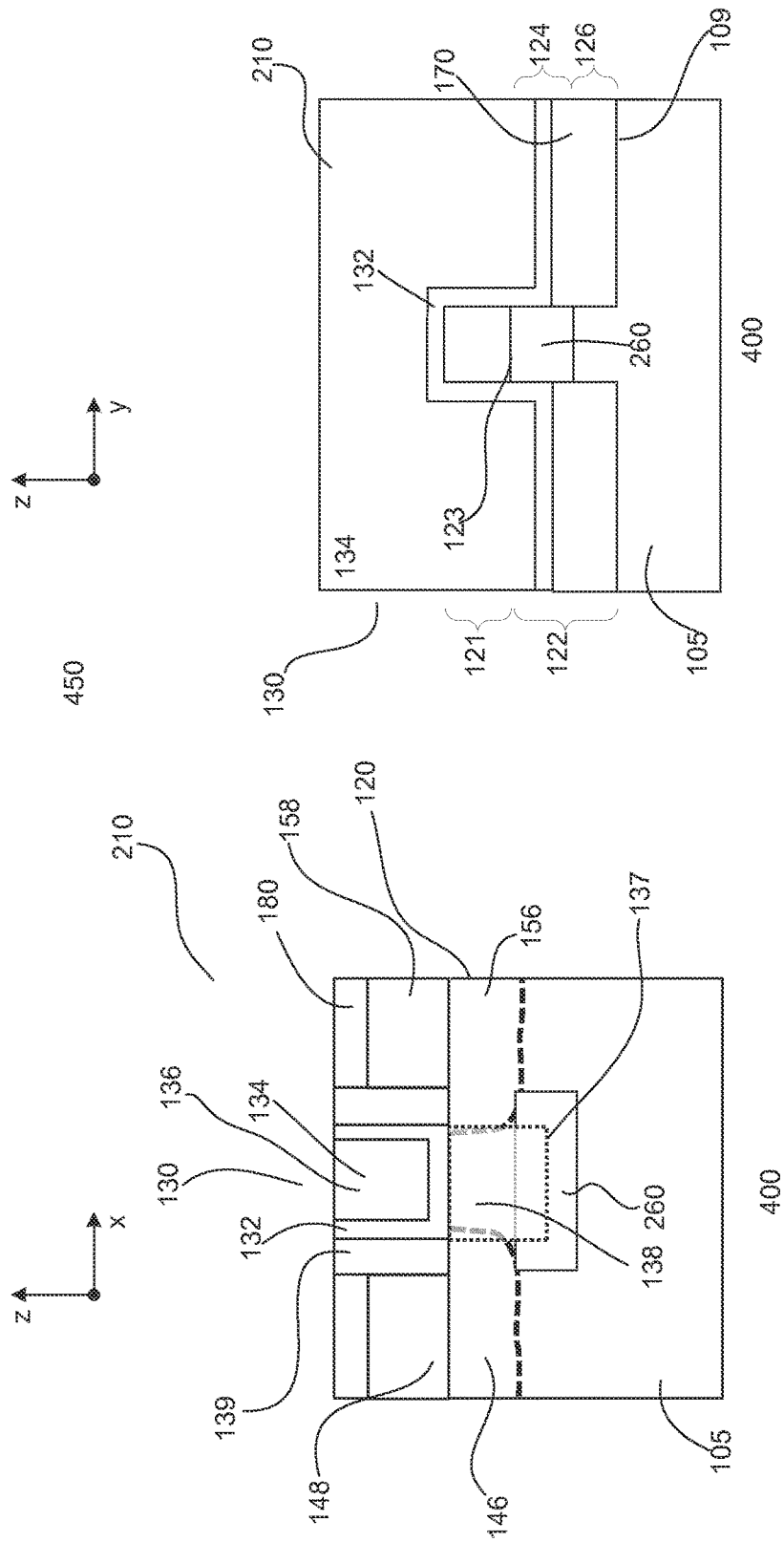

FINFET WITH ISOLATION

BACKGROUND

Fin-type transistors have been widely employed in, for example, sub-22 nm technology due to its ability to provide better performance, such as higher drive current, improved short channel effect and lower off-state leakages. Fin-type transistors are also preferred based on its ability for higher packing density. Forming fin-type field effect transistor (FinFET) on bulk substrates with junction isolation is generally used as a lower manufacturing cost solution relative to forming one on silicon on insulator (SOI) substrates. However, as devices continue to shrink, the source to drain leakage increases exponentially. To mitigate this, more channel/well doping is required, which leads to undesirable mobility/performance degradation. This further impedes scaling and may lead to the use of SOI FinFET to reduce leakages. The existing SOI FinFET solution, however, is relatively expensive and no body bias is possible. Additionally, self-heating effect which may result in performance degradation is commonly observed in such SOI devices.

From the foregoing discussion, it is desirable to provide fin type devices which are devoid of the above-mentioned problems and with improved performance. It is also desirable to provide efficient and cost effective methods for forming such devices.

SUMMARY

Embodiments generally relate to semiconductor devices and methods for forming a semiconductor device. In one embodiment, a method for forming a device is disclosed. The method includes providing a substrate prepared with a device region. A fin is formed in the device region. The fin includes top and bottom portions. An isolation layer is formed on the substrate. The isolation layer has a top isolation surface disposed below a top fin surface, leaving an upper fin portion exposed. At least one isolation buffer is formed in the bottom fin portion, leaving the top fin portion crystalline, the top fin portion serves as a body of a fin type transistor. Source/drain (S/D) regions are formed in the top portions of the fin and a gate wrapping around the fin is provided.

In another embodiment, a device is presented. The device includes a substrate prepared with a device region. A fin is disposed in the device region. The fin includes top and bottom portions. An isolation layer is disposed on the substrate. The isolation layer has a top isolation surface disposed below a top fin surface, leaving an upper fin portion exposed. At least one isolation buffer is disposed in the bottom fin portion, leaving the top fin portion crystalline and the top fin portion serves as a body of a fin type transistor. Source/drain (S/D) regions are disposed in the top portions of the fin. The device also includes a gate which wraps around the fin.

These and other objects, along with advantages and features of the present invention herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIGS. 1a-1d show various views of an embodiment of a device;

FIGS. 2a-2d show various views of another embodiment of a device;

FIGS. 3a-3g show cross-sectional views of an embodiment of a process of forming a device, where FIGS. 3a-3g with a subscript 1 relate to cross-sectional views of the device along the x-z plane perpendicular to the substrate surface at A-A' while FIGS. 3a-3g with a subscript 2 relate to corresponding cross-sectional views of the device along the y-z plane perpendicular to the substrate surface at B-B'; and FIGS. 4a-4f show cross-sectional views of another embodiment of a process for forming a device, where FIGS. 4a-4f with a subscript 1 relate to cross-sectional views of the device along the x-z plane perpendicular to the substrate surface at A-A' while FIGS. 4a-4f with a subscript 2 relate to corresponding cross-sectional views of the device along the y-z plane perpendicular to the substrate surface at B-B'.

DETAILED DESCRIPTION

The embodiments generally relate to devices, such as semiconductor devices or ICs. More particularly, some embodiments relate to transistors employed to form ICs. The ICs can be any type of IC. For example, the IC may be a dynamic or static random access memory, a signal processor, or a system on chip (SoC) device. The ICs can be incorporated into, for example, consumer electronic products, such as computers, cell phones, and personal digital assistants (PDAs). Other types of devices or products are also useful.

Figure 1A:
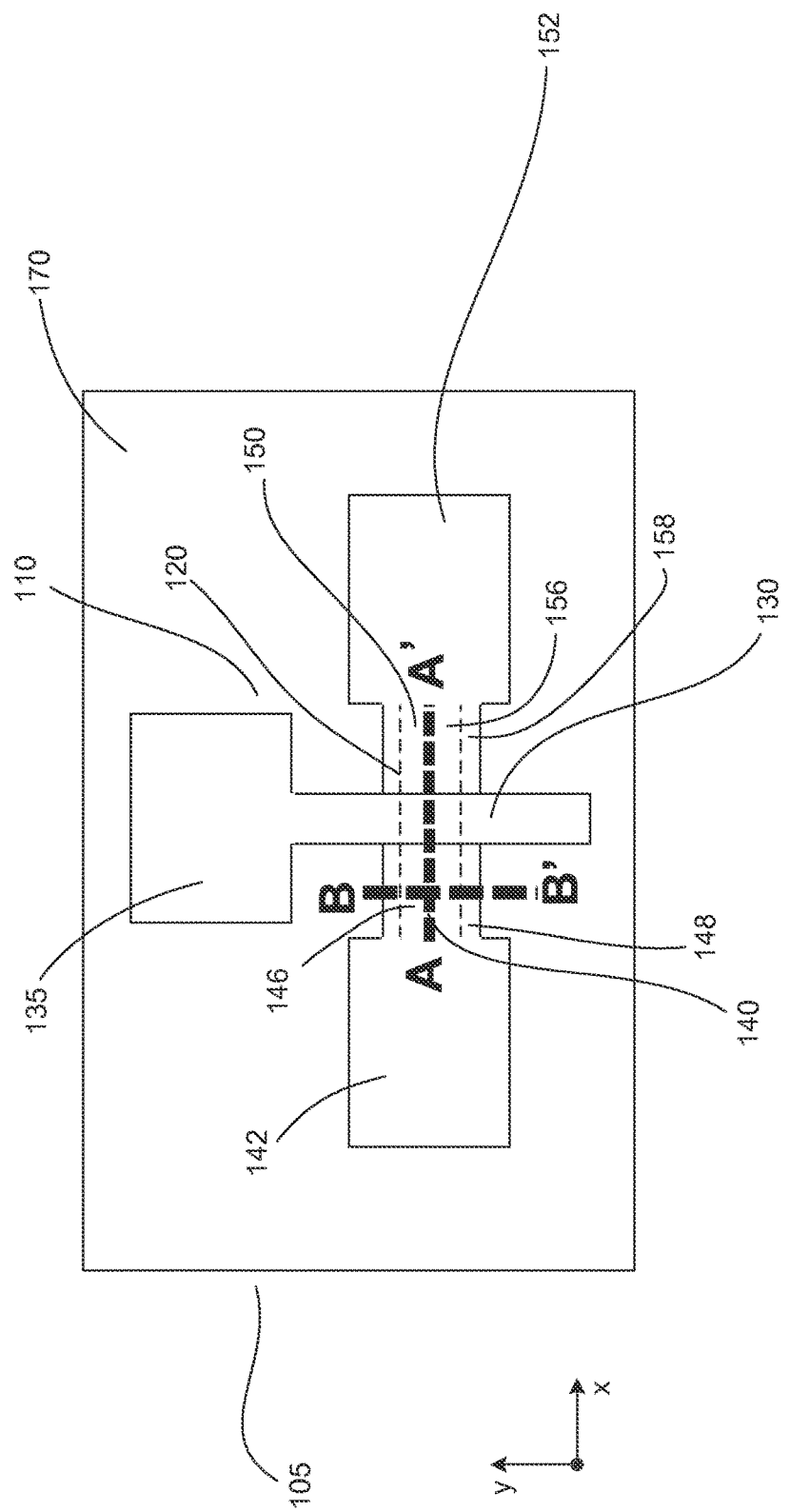
Figure 1B:
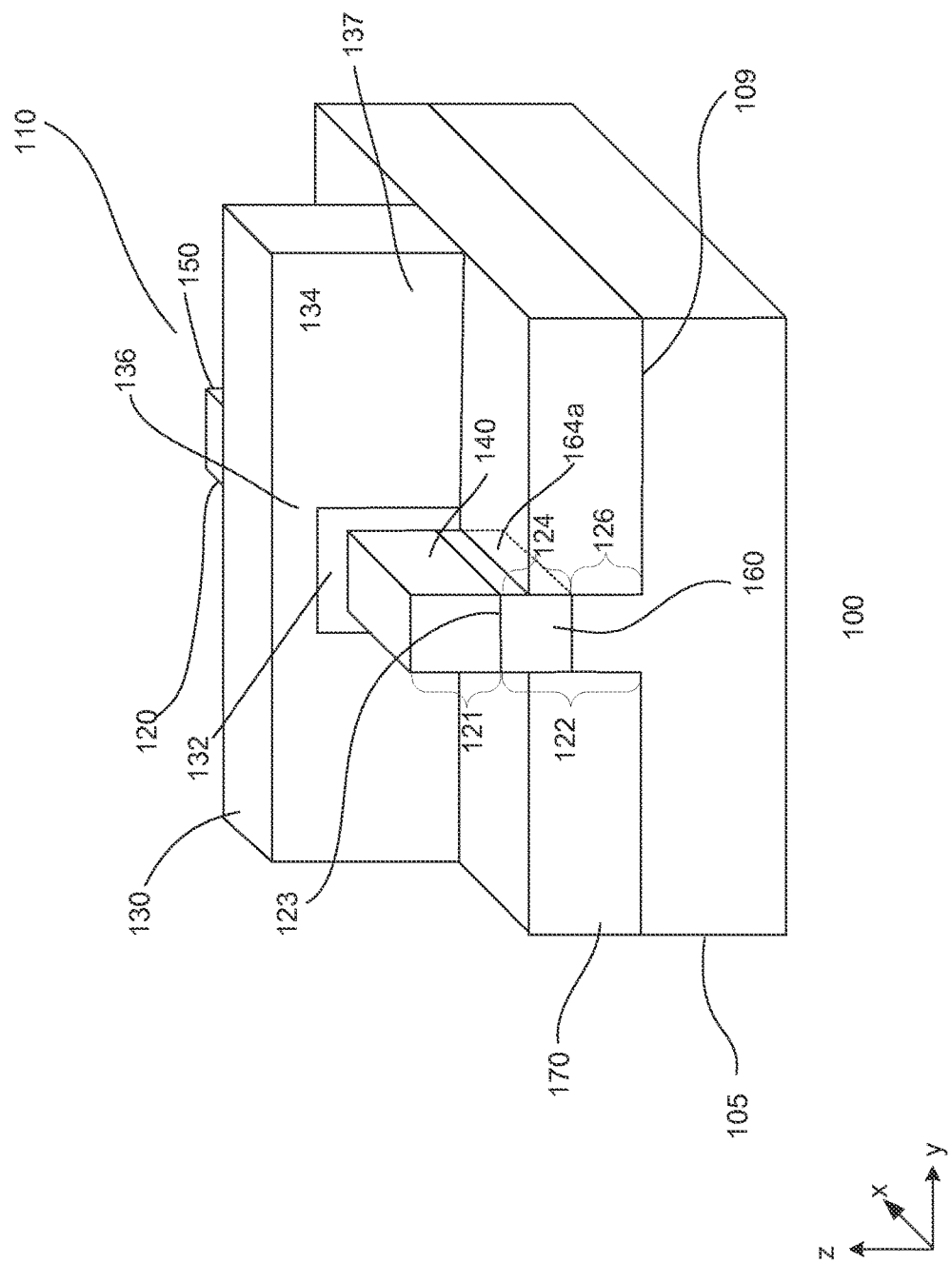
Figure 1C:
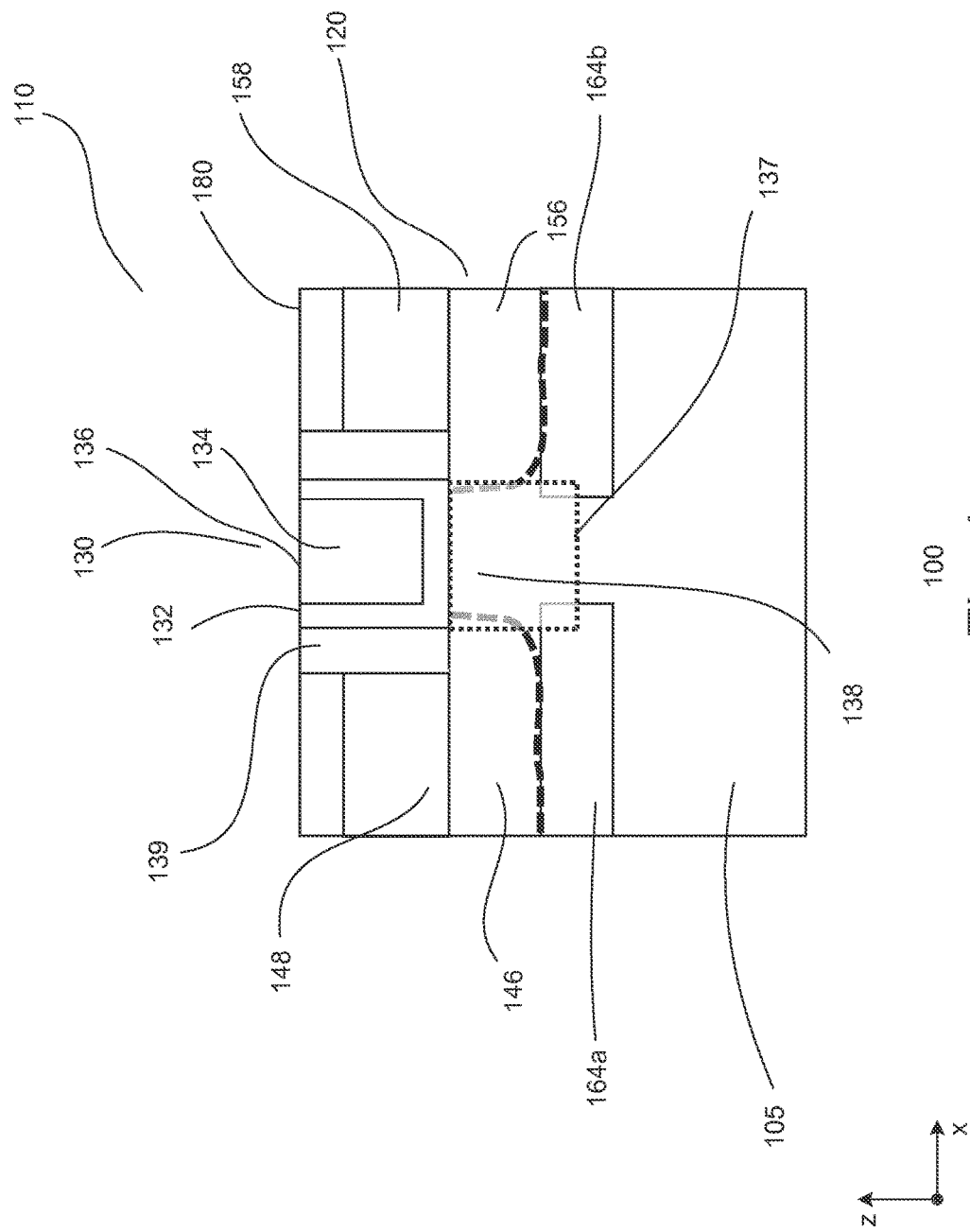

FIGS. 1a-1d show various views of an embodiment of a device 100. FIG. 1a shows a top view of the device; FIG. 1b shows a simplified 3-dimensional view of a portion of the device with some of the features, such as the gate dielectric spacers, raised source/drain (S/D) regions and interlevel dielectric (ILD) layer, not shown; FIG. 1c shows a cross-sectional view of the device along a x-z plane perpendicular to the substrate surface at A-A' and FIG. 1d shows a cross-sectional view of the device along a y-z plane perpendicular to the substrate surface at B-B'. The device, for example, is an IC. Other types of devices may also be useful. Referring to FIGS. 1a-1d, a substrate 105 serves as a base for the device. The substrate, for example, includes a silicon substrate. The substrate may be a lightly doped substrate. For example, the substrate may be a lightly doped p-type (p⁻) substrate. In some embodiments, the substrate may be a lightly doped n-type (n⁻) substrate. Other types of substrates may also be useful. For example, the substrate may be a heavily p-doped (p⁺), n-doped or intrinsic substrate or a substrate having other types of semiconductor materials, such as silicon-germanium (SiGe), germanium (Ge), gallium-arsenic (GaAs) or any other suitable semiconductor materials, including subsequently developed materials.

The substrate is prepared with a device region for a transistor 110. The transistor, in one embodiment, is a finFET. The device may include other device regions (not shown). For example, the substrate may include other device regions for which other types of transistors or components of the IC may be formed. For example, the substrate may include p-type and n-type components, such as high, medium and low voltage p-type and n-type components.

Various types of n-type and p-type wells are provided for these components. P-type dopants can include boron (B), aluminum (Al), indium (In) or a combination thereof, while n-type dopants can include phosphorus (P), arsenic (As), antimony (Sb) or a combination thereof.

The device region, for example, may be isolated from other device regions by, for example, an isolation layer 170. The isolation layer is disposed on a surface 109 of the substrate and around a fin structure as will be described later. The isolation layer, in one embodiment, is silicon oxide. In other embodiments, the isolation layer may be silicon nitride. Other suitable types of isolation layers, including multiple isolation layers, may also be useful. The isolation layer may also serve to electrically isolate a gate 130 of the transistor from the substrate. The isolation layer 170, for example, includes shallow trench isolation. The thickness of the isolation layer, for example, may be about 200-400 nm. In one embodiment, the thickness of the isolation layer may be about 280 nm. Other suitable thickness ranges may also be useful. The thicker the isolation layer, the better the isolation.

The transistor, in one embodiment, includes a fin structure 120. The fin structure extends from the top surface 109 of the substrate to above and beyond the top surface of the isolation layer 170. For example, the fin structure is disposed on the top surface of the substrate. The fin structure is an elongated member with a rectangular cross-sectional shape. Other types of fin structures may also be useful. As shown, the fin structure is disposed along a first direction (e.g., x direction).

The fin structure is formed of a material capable of having good or high carrier mobility. For example, the fin structure includes a crystalline material, such as silicon. Other fin materials, such as SiGe, Ge, GaAs, InP, InGaAs, GeSn, InSb or a combination of the various crystalline materials may also be employed. The fin may be an integral part of the substrate. For example, the fin structure is formed from patterning the substrate. In such cases, the fin structure has the same material as the substrate. Alternatively, the fin may be an epitaxial layer formed and processed on the surface of the substrate. In such cases, the fin structure may be of the same or different material from the substrate. Other configurations of the fin may also be useful.

The fin structure includes top and bottom fin portions 121 and 122. The top fin portion serves as a body of the transistor. The top fin portion includes material capable of having good or high carrier mobility, such as a crystalline material. An interface 123 of the top and bottom fin portions is disposed above the top surface of the isolation layer. The height or thickness of the top fin portion defines the device height. The device height, along with fin width, defines a channel width. Exemplary height of the top fin portion may be about 3-200 nm. In some embodiments, the height of the top fin portion is about 20-100 nm. The width of the top fin portion may be about 3-100 nm. Other suitable dimensions for the top fin portion may also be useful. The dimensions of the fin, for example, may be adjusted or tuned depending on device or design requirements.

The top fin portion 121, as discussed, serves as the body of the transistor. The top fin portion may be an intrinsic top fin portion. In some embodiments, the fin structure may be a lightly doped fin structure having second polarity type dopants. The second polarity type doped fin structure is used for, for example, a first polarity type device. For example, the fin structure may include p-type dopants for an n-channel device or n-type dopants for a p-channel device. For example, in the case where the fin is integral to the substrate, it would have the same polarity type as the substrate. The fin structure, for example, may have graded dopant concentration. For example, the top fin portion is lightly doped and the dopant concentration increases gradually nearer to the bottom fin portion.

A gate 130 is disposed on the isolation layer and fin. The gate, for example, is an elongated member with a rectangular cross-section. Other types of gates may also be useful. In one embodiment, the gate is disposed on the isolation layer along a second direction (e.g., y direction) and traverses the fin. The second direction, for example, is perpendicular to the first direction. Providing first and second directions which are not perpendicular to each other may also be useful. The isolation layer, for example, provides isolation to prevent the region under the gate on the isolation layer from turning on. The gate, as shown, wraps around the fin. For example, the gate includes a top gate portion 136 on top of the fin and side gate portions 137 extending from the top surface of the fin towards the top surface of the isolation region.

A channel 138 of the transistor is located in the upper portion of the fin below the gate. A channel length is equal to about a width of the gate. The width of the gate, for example, is about 3-1000 nm. The gate, as shown, traverses a single fin. It is understood that the gate, for example, may transverse multiple fins to make up for the required device width. Other suitable gate configurations and width dimensions may also be useful.

The gate, in one embodiment, includes a gate electrode 134 and a gate dielectric 132. The gate dielectric, for example, is disposed between the gate electrode and the fin. In one embodiment, the gate electrode is a metal gate electrode. For example, the metal gate electrode may be TaN, TiN, etc. As for the gate dielectric, it may be a high-k gate dielectric. For example, the gate dielectric layer may be $HfO_2$, HfSiON, $La_2O_3$, zirconium oxide or silicates thereof. In some embodiments, the gate dielectric may further include a work function tuning layer. For example, a $La_2O_3$ layer may be provided for a n-type device while a TiN/Al/TiN layer may be provided for a p-type device. Other suitable types of gate electrodes, gate dielectrics and work function tuning layers may also be useful. For example, the gate electrode may be polysilicon while the gate dielectric may be silicon oxide.

Gate dielectric spacers 139 may be disposed on sidewalls of the gate. The dielectric spacers, for example, may be silicon nitride. Other suitable types of dielectric materials may also be used. For example, the spacers may be silicon nitride or multiple layers of dielectric materials, such as silicon oxide and silicon nitride. The gate dielectric spacers, for example, are used to prevent shorts between the gate and diffusion regions, such as source/drain regions.

First and second source/drain (S/D) regions 140 and 150 are disposed in the top fin portion adjacent to sides of the gate. The S/D regions include dopants of a first polarity type for a first type device. For example, the S/D regions may contain n-type dopants for a n-type or re-channel device or p-type dopants for a p-type or p-channel device. The S/D regions, in one embodiment, are heavily doped regions. For example, the dopant concentration of the S/D regions may be about $10^{18}$-$10^{20}$ atoms/cm$^3$. The depth or bottom of the S/D regions, in one embodiment, is located at about the interface 123 of the top and bottom fin portions. For example, the bottoms of the S/D regions do not extend into the bottom fin portion. Providing the bottom of the S/D regions at other locations in the top fin portion may also be useful. For example, the bottom of the S/D regions may be located above or below the surface of the isolation layer 170.

In one embodiment, the S/D regions include base and raised portions. For example, the first S/D region 140 includes a first base portion 146 and a first raised portion 148; the second S/D region 150 includes a second base portion 156 and a second raised portion 158. The base portion is disposed in the fin structure while the raised portion is disposed on the fin structure. The raised portion, in one embodiment, is an epitaxial layer disposed on the fin structure. The raised portions may abut the gate spacers 139. The raised portions, for example, include a thickness lower than a height of the gate. For example, the thickness of the raised portions may be about 10-100 nm. Other suitable thickness ranges may also be useful.

The S/D regions may optionally be provided with S/D extension regions. The S/D extension regions may be lightly doped portions of the S/D regions. The dopant concentration of the S/D extension regions may be about $10^{19}$ cm$^{-3}$. Other dopant concentrations may also be useful. The extension regions, in one embodiment, extend from the S/D regions at about the edge of the spacers to the edge of the gate sidewalls. For example, the extension regions are disposed beneath the spacers, extending from the S/D regions to the gate sidewalls. In some embodiments, the S/D extension profile may extend beneath the gate. Providing a S/D extension profile which overlaps the gate may increase resistance and have better short channel effect. Alternatively, no S/D extension regions are formed in the case whether the gate dielectric spacers are sufficiently thin. In this case, deep S/D regions may diffuse towards the gate for better short channel effect.

First and second S/D pads 142 and 152 for S/D contact landing may be provided. The first and second S/D pads are coupled to the ends of the fin. For example, the first S/D pad 142 is coupled to a first end of the fin and the second S/D pad 152 is coupled to a second end of the fin. The S/D pads may be rectangular in shape. Other shapes may also be useful. The S/D pads, in one embodiment, may be integral parts of the fin. For example, the S/D pads may be heavily doped with first polarity type dopants and may be an extension of the S/D regions. Other types or configurations of pads may also be useful. Contacts may be coupled to the S/D pads for coupling to the S/D regions.

A gate contact pad 135 may be provided on the isolation layer. The gate contact pad is coupled to, for example, an end of the gate. As shown, the gate is provided with one contact pad disposed at a first end of the gate. The gate contact pad may be rectangular in shape. Other shapes may also be useful. The gate contact pad, in one embodiment, may be an integral part of the gate. Other types or configurations of gate contact pad may also be useful.

As discussed, the fin structure includes a bottom portion 122. In one embodiment, the bottom portion includes upper and lower bottom fin portions 124 and 126. The upper bottom fin portion 124 abuts the top fin portion while the lower bottom fin portion 126 abuts the substrate. An isolation buffer 160 is disposed in the upper bottom fin portion 124. The isolation buffer may include a dielectric material, such as silicon oxide. Other dielectric materials may also be useful. In other embodiment, the dielectric material includes air, forming an isolation buffer which is a void. Providing an isolation buffer having a combination of dielectric materials may also be useful. For example, the isolation buffer may include oxide and air, forming an oxide/nothing isolation buffer. The height of the upper bottom fin portion, for example, may be about 5-200 nm. Other suitable thickness ranges may also be useful.

The isolation buffer 160 is disposed in one or more segments of the upper bottom fin portion, partially isolating the transistor, such as the S/D regions, from the substrate. The segment or segments without the isolation buffer remain crystalline, partially connecting the remaining parts of the transistor to the substrate.

In one embodiment, the isolation buffer includes first and second isolation buffer portions 164a-164b. The isolation buffer portions are disposed below the S/D regions. For example, the first isolation buffer portion is disposed below the first S/D region 140 and the second isolation buffer portion is disposed below the second S/D region 150. A crystalline fin region under the channel of the transistor separates the two isolation buffer portions. For example, no isolation buffer is provided under the channel. The isolation buffer portions may extend slightly under the channel. For example, the isolation buffers may extend to about 5-20% under the channel. In one embodiment, the isolation buffer portions include a dielectric material, such as silicon oxide. Other suitable types of dielectric materials or combination of dielectric materials, such as but not limited to air or oxide or a combination thereof, may also be useful.

As shown, the gate wraps around the fin structure. For example, the gate covers the top and side surfaces of the fin structure, forming a tri-gate structure. Alternatively, a hard mask may be disposed over the top surface of the fin. In this case, the gate covers the side surfaces of the fin structure, forming a double-gate structure. In a conventional double gate configuration, the double gate is connected at the top and has one gate pad. In an alternative double gate configuration (also known as independent double gate configuration), the gate will disconnect on top of the fin and two gate pads may be provided to individually control the two separate gates. Furthermore, although a single fin structure is shown, some embodiments may include a plurality of fin structures configured in a closely packed manner. The fin structures may be controlled by a common gate. Such an arrangement forms, for example, multiple transistors arranged in a finger configuration to increase drive current. In other embodiments, the fin structures may be independently controlled by respective gates or a combination of common and independent gates.

As discussed, the isolation buffer portion isolates the S/D regions from the substrate while connecting the channel to the substrate. Isolating the S/D regions advantageously reduces leakage by lowering junction capacitance $C_j$. As for connecting the channel of the transistor to the substrate, this enables the body of the transistor to be biased or modulated. Connecting the channel of the transistor to the substrate also enables heat to be dissipated, thereby reducing self-heating effect. Ina conventional case, the leakage path flows from source to drain, away from gate control, which is undesirable. On the other hand, the side gate region, in the embodiment as described, includes a bottom which extends beyond the bottom of the S/D regions. Extending the side gate region vertically beyond the bottom of the S/D regions thus ensures that the potential in the channel along the source to drain is significantly influenced by the gate potential. This improves gate control and leakage path is reduced due to better gate control. As also discussed, the S/D regions include raised portions. Providing raised S/D regions increases volume of the S/D regions. This increases stress to improve carrier mobility as well as lowering parasitic series and contact resistance. The various advantages improve device performance and reliability.

Figure 2B:
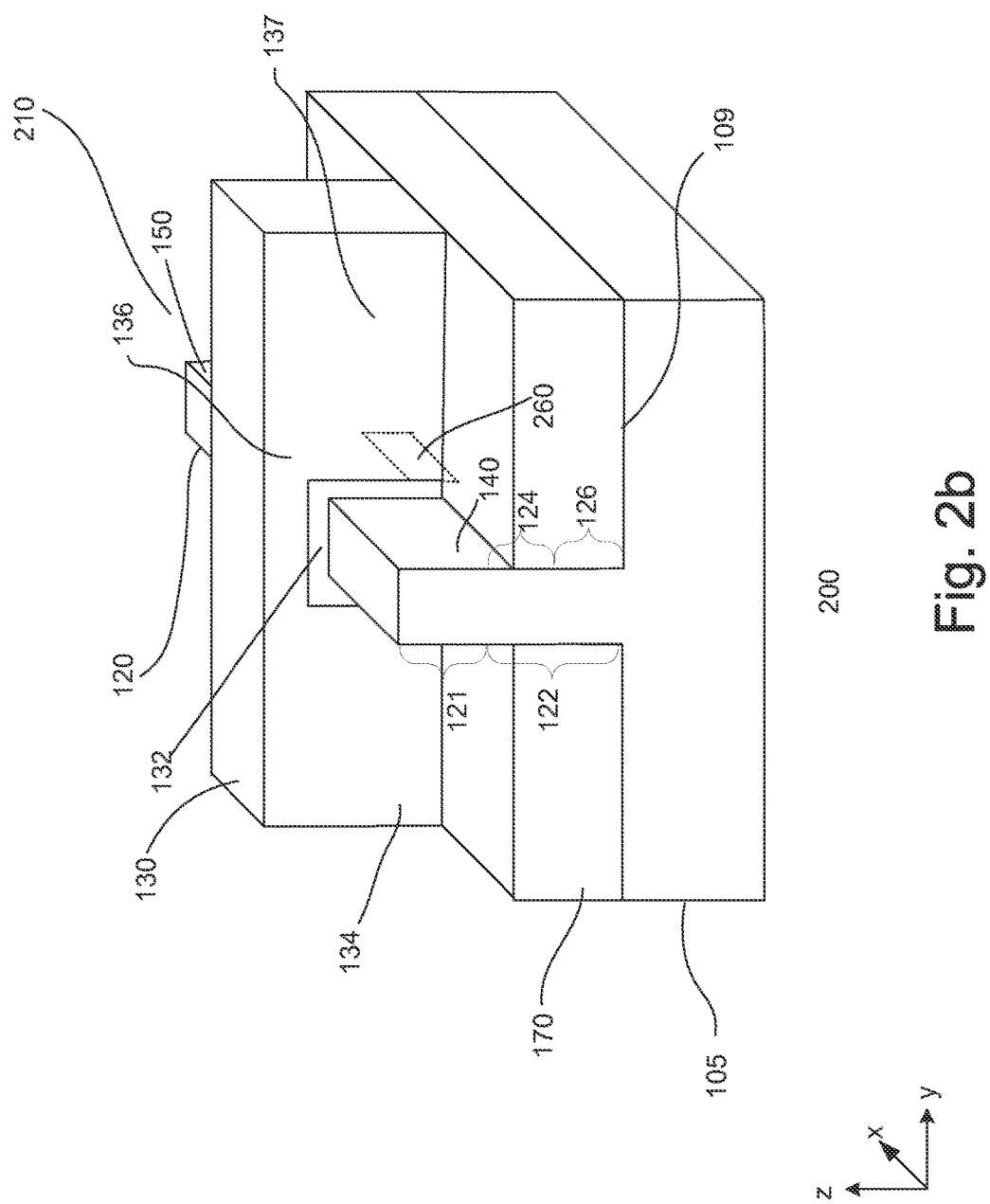
Figure 2C:
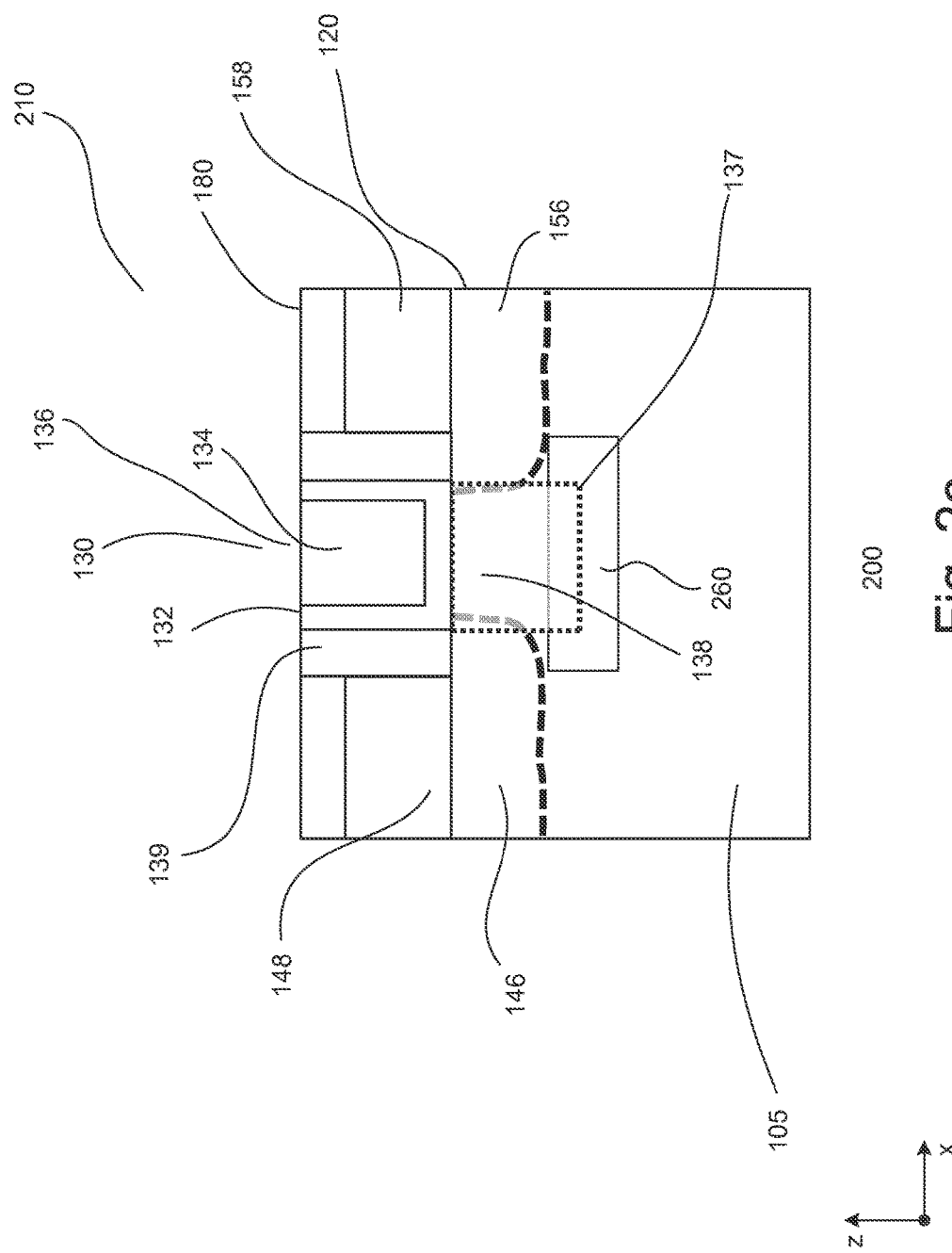

FIGS. 2a-2d show various views of another embodiment of a device 200. FIG. 2a shows a top view of the device;

FIG. 2b shows a simplified 3-dimensional view of a portion of the device with some of the features, such as the gate dielectric spacers, raised source/drain (S/D) regions and interlevel dielectric (ILD) layer, not shown; FIG. 2c shows a cross-sectional view of the device along a x-z plane perpendicular to the substrate surface at A-A' and FIG. 2d shows a cross-sectional view of the device along a y-z plane perpendicular to the substrate surface at B-B'. The device 200 is similar to the device 100 and differs from the device 100 in one or more aspects. In the interest of brevity, the description of device 200 below primarily focuses on the difference(s) between the device 200 and the device 100. Common elements of features may not be described or described in detail.

Referring to FIGS. 2a-2d, a substrate 105 serves as a base for the device. The substrate, for example, includes a silicon substrate. Other types of substrates may also be useful. The substrate is prepared with a device region for a transistor 210. The transistor, in one embodiment, is a finFET. The device region may be isolated from other device regions by, for example, an isolation layer 170. The isolation layer is disposed on a surface 109 of the substrate. The isolation layer, for example, is silicon oxide. Other types of isolation layers, including multiple isolation layers, may also be useful.

The transistor 210 includes a fin structure 120 extending from the top surface of the substrate to above a top surface of the isolation layer 170. A gate 130 is disposed on the isolation layer and wraps around the fin. S/D regions 140 and 150 are disposed in the fin adjacent to the gate. The S/D regions include base 146 and 156 and raised 148 and 158 S/D regions. The gate includes top 136 and side portions 137. The side gate portion includes a bottom which extends beyond the bottom of the S/D regions.

An isolation buffer 260 is provided in an upper bottom fin portion 124. In one embodiment, the isolation buffer is disposed below the channel 138 of the transistor. For example, the isolation buffer is disposed below the channel while the upper bottom fin portions below the S/D regions are crystalline, similar to the top fin portion. The isolation buffer 260 may extend beyond the channel slightly. For example, the isolation buffer may extend to about an outer edge of the spacers, which result it being under the extension S/D regions.

The isolation buffer may include a dielectric material, such as silicon oxide. Other dielectric materials may also be useful. In other embodiments, the dielectric material includes air, forming an isolation buffer which is a void. Providing an isolation buffer having a combination of dielectric materials may also be useful. For example, the isolation buffer may include oxide and air, forming and oxide/nothing isolation buffer.

As discussed, the isolation buffer portion 260 isolates the channel from the substrate while connecting the S/D regions to the substrate. Isolating the channel advantageously reduces leakage. Gate height variation is also reduced as the channel thickness is fixed by the isolation buffer portion 260. As for connecting the S/D regions to the substrate, this reduces self-heating effect. Regarding the gate, it includes top gate and side gate regions. The side gate region, in one embodiment, includes a bottom which extends beyond the bottom of the S/D regions. This improves gate control and reduces leakages as described earlier. As also discussed, the S/D regions include raised portions. Providing raised S/D regions increases volume of the S/D regions. This increases stress to improve carrier mobility as well as lowering parasitic series and contact resistance. The various advantages improve device performance and reliability.

FIGS. 3a-3g show cross-sectional views of an embodiment of a process 350 for forming a device or IC 300. Figures with a subscript 1 relate to cross-sectional views of the device along the x-z plane perpendicular to the substrate surface at A-A' and while those with a subscript 2 relate to corresponding cross-sectional views of the device 300 along the y-z plane perpendicular to the substrate surface at B-B'. The device 300 is similar to the device 100 as described in FIGS. 1a-1d. Common elements may not be described or described in detail.

FIGS. $3a_1$-$3a_2$ depict fin formation with isolation. As shown, a substrate 105 is provided. The substrate may be prepared with a device region. The device region, for example, serves as a region for a transistor. In one embodiment, the device region serves as a region for a finFET. Although the substrate is described with one device region, it is understood that the substrate may include numerous device regions (not shown). The numerous device regions may include different types of device regions.

Referring to FIGS. $3a_1$-$3a_2$, the substrate is processed. For example, a fin structure 120 is formed on the substrate 105 to protrude from the substrate, and an isolation layer 370 is formed on the substrate and around the fin structure. The substrate serves as a base for the device. In some embodiments, the substrate may be a bulk semiconductor substrate. The bulk substrate may be a silicon substrate. The substrate may be lightly doped with, for example, p-type or n-type dopants. Providing other types of substrates, including SiGe, Ge and group III-V semiconductors such as GaAs, InP and InAs, including substrates doped with other types of dopants or undoped substrates, are also useful.

Forming the fin structure 120 may be achieved using various methods. In one embodiment, ion implantation processes are performed on portions of the substrate to define the well region (not shown). Then, the substrate is patterned. For example, a patterned hard mask 380 is formed over the substrate. In one embodiment, a hard mask layer, such as silicon oxide or silicon nitride, is formed on the substrate 105. Other suitable types of materials which are selective to the isolation layer may also be used as the hard mask layer. The hard mask layer may be formed by chemical vapor deposition (CVD). Other suitable types of hard mask or techniques for forming the hard mask may also be useful.

The hard mask layer is patterned to correspond to the shape of the fin structure 120. The patterning of the hard mask layer can be achieved by mask and etch techniques. For example, a patterned soft mask (not shown), such as photoresist, may be used as an etch mask to pattern the hard mask layer. The soft mask may be patterned by photolithography. To improve lithographic resolution, an ARC (not shown) may be provided beneath the photoresist. The pattern of the photoresist mask is transferred to the hard mask by, for example, an anisotropic etch, such as a reactive ion etch (RIE). The soft mask is removed. An anisotropic etch, such as a RIE, is performed to remove portions of the substrate surface unprotected by the hard mask, leaving a fin structure 120 as described above disposed on the top surface of the substrate. Alternatively, the fin structure may be formed by forming a blanket epitaxial layer over the substrate. The process continues to form the hard mask 380 as described over the epitaxial layer and performing the patterning and etching process to form a shape corresponding to the fin structure and removing portions of the substrate adjacent to the fin structure. Other suitable methods may also be employed to form the fin structure.

The height of the fin, for example, may be about 10-1000 nm. For example, the height of the fin may be about 500 nm. As for the fin width, it may be about 3-100 nm. For example, the fin width may be about 20 nm. Other suitable fin dimensions may also be useful. The fin may include top and bottom fin portions 121 and 122. The top fin portion serves as the body of a transistor. The thickness of the top fin portion 121, for example, may be about 3-200 nm. In one embodiment, the thickness of the top fin portion may be about 50 nm. Other suitable thicknesses may also be useful. The fin, for example, may be patterned to include first and second pads at first and second ends. The hard mask 380, as shown, remains on the top surface of the fin.

The process continues to form the isolation layer. An isolation layer, such as an oxide layer, is formed over the substrate covering the fin structure. The isolation layer, for example, may be formed over the substrate using chemical vapor deposition (CVD) or high aspect ratio process (HARP). Other techniques for forming the isolation layer may also be useful. In one embodiment, a polishing process, such as a chemical mechanical polishing process (CMP) is performed to planarize the isolation layer to the top surface of the hard mask over the fin structure. A selective etching process, such as selective to the oxide material, is performed to remove or recess portions of the oxide to form the isolation layer 370 having a thickness $T_1$ as shown in FIG. $3a_2$. The thickness $T_1$ should have a thickness such that a top surface of the isolation layer 370 after the selective etching process is above or about an interface 123 of the top and bottom fin portion. The thickness $T_1$, for example, may be about 100-1000 nm. In one embodiment, the thickness $T_1$ may be about 300 nm. In other embodiments, the thickness $T_1$ may be about 500 nm. Other suitable thicknesses may also be useful.

Referring to FIGS. $3b_1$-$3b_2$, a dummy gate layer 334 is formed on the substrate. The dummy gate layer includes a dummy gate dielectric and a dummy gate electrode stack. The dummy gate dielectric, for example, includes silicon oxide while the dummy gate electrode includes polysilicon. Other suitable types of materials may also be used as the dummy gate dielectric and dummy gate electrode. For simplicity, the dummy gate layer is shown as a single layer. The dummy gate layer is patterned to form a dummy gate 330 and a dummy gate pad (not shown). Patterning the dummy gate, in one embodiment, is achieved using a patterned gate hard mask 390. For example, a RIE may be performed using the patterned gate hard mask 390 to pattern the dummy gate layer. The gate hard mask 390, in one embodiment, is a silicon nitride hard mask. The gate hard mask 390, in one embodiment, includes the same material as the hard mask 380 used to form the fin. In another embodiment, the gate hard mask 390 may include different material than the hard mask 380. The gate hard mask 390 remains on the top surface of the dummy gate.

As shown in FIGS. $3c_1$-$3c_2$, protective liners 375a-375b are formed on sidewalls of the dummy gate 330 and sidewalls of the top fin portion 121. In one embodiment, the protective liners include silicon nitride. Other types of materials which can be selectively etched to the isolation layer on the substrate may also be useful. In one embodiment, the protective liners include the same material as the hard mask. In another embodiment, the protective liners may include different material than the hard mask. Other configurations of protective liners and hard masks may also be useful. To form the protective liners, a protective layer may be blanket deposited over the substrate, for example, by a CVD process. The thickness of the protective layer may be about, for example, 5-20 nm. An anisotropic etch, such as reactive ion etch (ME), is performed to remove horizontal portions of the layer, leaving vertical portions of the protective layer to form the protective liners. For example, the remaining vertical portions of the protective layer include, but are not limited to, protective liners on the sidewalls of the dummy gate and the top fin portion. The etch removes horizontal portions of the protective layer over the isolation layer as well as over the hard mask and gate hard mask.

The isolation layer 370, in FIGS. $3d_1$-$3d_2$, is recessed below the protective liners 375a-375b. For example, the thickness $T_1$ of the isolation layer is thinned to a second thickness $T_2$. The thickness $T_2$, for example, may be about 200-400 nm. In one embodiment, the thickness $T_2$ is about 280 nm. Other suitable thicknesses may also be useful. This exposes portions 329 on sides of the fin between the protective liners and surface of the recessed isolation layer 170. A distance D between the liner and top surface of the recessed isolation layer should be sufficient for subsequent processing to form an isolation buffer in the bottom portion of the fin. The distance D, for example, may be about 10-100 nm. In one embodiment, the distance D is about 10 nm. Other suitable distances may also be useful. Recessing of the isolation layer may be performed by an etch. The etch, for example, may be an anisotropic etch, such as a dry etch. For example, the recess process involves an anisotropic etch, such as RIE.

Referring to FIGS. $3e_1$-$3e_2$, the process continues to form isolation buffers 164a-164b in the exposed bottom fin portions. In one embodiment, the isolation buffers include dielectric material. In one embodiment, a thermal oxidation process is performed. The oxidation oxidizes exposed portions of the fin as well as portions below the top surface of the isolation layer 170, forming oxide isolation buffers. The isolation buffers, as shown, may include portions extended slightly above the bottom of the protective liners and extended slightly under the dummy gate. The isolation buffers should be sufficiently thick to provide the desired isolation. For example, the isolation buffers should be about 10 nm thick. Other thicknesses may also be useful. To enhance oxidation, the bottom fin portion may be heavily doped with dopants. For example, the bottom fin portion may be heavily doped with p or n-type dopants. These dopants, for example, serve to enhance oxidation and/or for better etch selectivity purposes. The dopant concentration of these dopants, for example, may be about 1E18-1E19 $cm^{-3}$. Other suitable types of dopants and dopant concentrations may also be useful. In one embodiment, the dummy gate 330 protects the bottom fin portion below the channel 138 from being oxidized as shown in FIGS. $3e_1$-$3e_2$.

In another embodiment, the isolation buffers are voids in the upper bottom fin portion. To form voids, an isotropic etch, such as a wet etch, is performed. In one embodiment, the wet etch removes exposed oxidized portions of the fin as well as unexposed portions below the surface of the isolation layer to form complete voids. The wet etch, for example, may be a HF etch to remove the oxidized portions. In an alternate embodiment, to form voids, a wet etch which employs KOH, $NH_4OH$ or TMAH is performed after formation of the protective liners and recessing the isolation layer to remove exposed portions of the fin as well as unexposed portions below the surface of the isolation layer. Other types of wet etches may also be useful. The dummy gate, in one embodiment, protects the bottom fin portion below the channel from being etched.

In yet another embodiment, the isolation buffers are hybrid isolation buffers. The hybrid isolation buffers include a combination of dielectric material and a plurality of voids within the dielectric material. To form the hybrid isolation buffers, an oxidation process is performed to oxidize exposed portions of the fin portion and voids within the oxide buffers could be formed due to this oxidizing process, resulting in hybrid isolation buffers. Alternatively, the hybrid isolation buffers may be formed by filling the complete voids as discussed in the preceding paragraph with an oxide material. A plurality of voids could be formed within the oxide material during the filling process, forming the hybrid isolation buffers. The dummy gate prevents the hybrid buffers from forming in the bottom fin portion below the channel.

In FIGS. $3f_1$-$3f_2$, the process continues to form the transistor. The protective liners are removed. For example, a wet etch selectively removes the protective liners and the hard masks, exposing the dummy gate. After the wet etch to remove the protective liners, a RIE may be performed to align the hard mask 380 with the gate. Lightly doped or extended S/D regions are formed in the upper fin portion adjacent to the dummy gate. The extended S/D regions are formed by implanting first polarity type dopants into the upper fin portion. The implant process is performed at a dose of about 5E14 cm$^{-2}$. The extended S/D regions include a depth of about 2-10 nm and dopant concentration of about 1E19 cm$^{-3}$. Other suitable depth dimensions and concentrations may also be useful. An implant mask (not shown) may be employed to prevent other parts of the device from being implanted with dopants.

Sidewall spacers 139 are formed on sidewalls of the dummy gate. To form the spacers, a dielectric spacer layer, such as silicon oxide, is formed on the substrate, covering the dummy gate, fin and isolation layer. The spacer layer may be formed by CVD. Other techniques for forming the spacer layer may also be useful. An anisotropic etch, such as RIE, is performed to remove horizontal portions of the spacer layer, leaving spacers on sidewalls of the dummy gate. An over etch process may also be performed to remove spacer material over the fin.

S/D regions 140 and 150 are formed on exposed regions of the upper fin portion. In one embodiment, the S/D regions serve as base S/D regions 146 and 156. The base S/D regions are heavily doped with first polarity type dopants. The S/D regions are formed by implanting first polarity type dopants into the upper fin portion. The implant process is performed at a dose of about 2E15 cm$^{-2}$. The S/D regions include a depth of about 5-20 nm and dopant concentration of about $10^{20}$ cm$^{-3}$. Other suitable depth dimensions and dopant concentration as well as dose may also be useful. An implant mask (not shown) may be employed to prevent other parts of the device from being implanted with dopants.

Raised S/D regions 148 and 158 are formed on the base S/D regions in the upper fin portion. The raised S/D regions are formed by selective epitaxial growth (SEG). The SEG selectively forms raised crystalline S/D region on exposed portions of the upper fin portion. As shown, the raised S/D regions have a faceted cross-section profile, due to the different surfaces of the fin and isolation buffers. The height of the raised S/D regions should be below the top surface of the dummy gate. The raised S/D regions are heavily doped with first polarity type dopants and stressors. The stressors may be Si:C or Si for n-channel and SiGe for p-channel. Other suitable types of stressors may also be useful. The dopants may be incorporated into the raised S/D regions by in-situ doping or could be incorporation by implantation process. Other techniques for incorporating the dopants into the raised S/D regions may also be useful.

Referring to FIGS. $3g_1$-$3g_2$, an interlevel dielectric (ILD) layer 180 is formed on the substrate, covering the fin, dummy gate and isolation layer. The ILD layer, for example, may be silicon oxide formed by CVD. Other types of ILD layer or forming techniques may also be useful. The ILD layer is planarized, forming a co-planar top surface with the dummy gate. For example, a chemical mechanical polish (CMP) is performed to planarize the ILD layer and dummy gate.

After planarization, the exposed dummy gate is selectively removed. Removal of the dummy gate may be performed by dry etch, wet etch or a combination thereof. For example, a wet etch selective to the ILD layer and sidewall spacers may be performed. To form a tri-gate structure, the hard mask 380 below the dummy gate on the fin is also selectively removed using a wet etch. The dummy gate and hard mask may be removed by wet etch using different chemistries. Alternatively, the dummy gate and hard mask may be removed by dry etch at one go with different sub-steps. Removal of the dummy gate and hard mask leaves a gate trench on the substrate. In an alternate embodiment, to form a double gate structure, the dummy gate is removed without removing the hard mask 380. The hard mask remains in the gate trench for a double gate structure.

In one embodiment, a metal gate 130 is formed on the substrate in the gate trench. Forming the metal gate includes forming a high-k gate dielectric layer 132 on the substrate. The gate dielectric layer lines the gate trench and ILD layer. The high-k gate dielectric layer, for example, may be HfO$_2$, HfSiON, La$_2$O$_3$, zirconium oxide or silicates thereof formed by atomic layer deposition (ALD) process. A metal gate electrode layer 134, such as TaN or TiN, may be formed over the gate dielectric layer by ALD, CVD or physical vapor deposition (PVD). A work function tuning layer may be formed in between the metal gate electrode and the high-k gate dielectric layer. Other types of gate dielectric materials, electrode materials or forming techniques may also be useful. These layers are planarized, forming a planar top surface between the ILD, gate dielectric and gate electrode. The metal gate wraps around the fin structure and includes top gate and side gate regions 136 and 137. As shown, the side gate region 137, in one embodiment, includes a bottom which extends beyond the bottom of the base S/D regions 146 and 156.

Additional processes may be performed to complete the device. For example, additional processes include forming contacts to the transistor. For example, contact openings are formed to the contact pads onto the exposed contact regions. Silicide contacts may be formed on exposed contact regions. Contact plugs are formed in the contact openings with the silicide contacts. Additional processes may include back end of line process to finish the manufacturing of the device, such as forming of one or more interconnect levels, final passivation, dicing, assembly, packaging and testing. Other processes are also useful. For example, other components, such as low voltage, medium voltage, and high voltage I/O devices can be formed prior to forming the interconnections.

As described, the formation of dummy gate is performed prior to forming the protective liner. For example, the protective liner lines the dummy gate. In another embodiment, the process steps of FIGS. 3a-3g above may be modified. In this alternate embodiment, the protective layer or liner may be formed prior to the dummy gate formation. For example, the protective liner lines the fin. A dummy gate electrode is then formed over the protective liner. As such, the protective liner may serve as the dummy gate dielectric of the dummy gate. The process continues to etch the dummy gate. In this case, the dummy gate etch with recess would expose the fin with recessed isolation layer having the reduced thickness $T_2$ in a single step since the isolation layer and the protective liner in this alternate embodiment includes the same material.

FIGS. 4a-4f show cross-sectional views of another embodiment of a process 450 for forming a device or IC 400. Figures with a subscript 1 relate to cross-sectional views of the device along the x-z plane perpendicular to the substrate surface at A-A' while those with a subscript 2 relate to corresponding cross-sectional views of the device 400 along the y-z plane perpendicular to the substrate surface at B-B'. The device 400 is similar to the device 200 as described in FIGS. 2a-2d. Common elements may not be described or described in detail.

FIGS. $4a_1$-$4a_2$ depict fin formation and isolation. Specifically, a substrate 105 is prepared, a fin structure 120 is formed on the substrate to protrude from the substrate and an isolation layer 370 is formed on the substrate and around the fin structure. The substrate, isolation and fin structure formation are the same as that already described in FIGS. $3a_1$-$3a_2$. For example, the patterned hard mask 380 remains on the top surface of the fin, the same as that shown in FIGS. $3a_1$-$3a_2$. Other suitable techniques may also be used to form the fin structure 120 with the isolation layer 370.

FIGS. $4b_1$-$4b_2$ depict dummy gate formation. Specifically, a first gate dielectric layer 432a and a dummy gate layer 434 are formed over the substrate. The first gate dielectric layer 432a, for example, may be silicon oxide $SiO_2$. Other suitable materials may also be used. The first gate dielectric layer, for example, is selectively formed over the exposed portions of the fin structure. For example, as shown in FIG. $4b_2$, the first gate dielectric layer is formed on exposed sidewalls of the fin structure by thermal oxidation process. As for the dummy gate layer 434, it may include polysilicon. The dummy gate layer, for example, is conformally formed over the substrate, covering the hard mask 380, the first gate dielectric 432a and the isolation layer 370. The dummy gate layer 434 may be formed by ALD, CVD or PVD. Other suitable types of dummy gate layer and forming techniques may also be useful.

The dummy gate layer is patterned to form a dummy gate 430 and gate pad (not shown). Patterning the dummy gate, in one embodiment, is achieved using a patterned gate hard mask 490. For example, a RIE may be performed using the patterned gate hard mask 490 to pattern the dummy gate layer. The gate hard mask, in one embodiment, is a silicon nitride hard mask. In one embodiment, the gate hard mask 490 includes the same material as the hard mask 380 used to form the fin. In another embodiment, the gate hard mask 490 includes different material than the hard mask 380. The gate hard mask 490 remains on the top surface of the dummy gate.

Referring to FIGS. $4c_1$-$4c_2$, lightly doped or extended S/D regions are formed in the upper fin portion adjacent to the dummy gate. The extended S/D regions are formed by implanting first polarity type dopants into the upper fin portion. The implant process is performed at a dose of about 5E14 $cm^{-2}$. The extended S/D regions include a depth of about 2-10 nm and dopant concentration of about 1E19 $cm^{-3}$. Other suitable depth dimensions and dopant concentration as well as dose may also be useful. An implant mask (not shown) may be employed to prevent other parts of the device from being implanted with dopants.

The process continues to form sidewall spacers. Sidewall spacers 139 are formed on sidewalls of the dummy gate. To form the spacers, a dielectric spacer layer, such as silicon oxide, is formed on the substrate, covering the dummy gate, fin and isolation layer. The spacer layer may be formed by CVD. Other techniques for forming the spacer layer may also be useful. An anisotropic etch, such as RIE, is performed to remove horizontal portions of the spacer layer, leaving spacers on sidewalls of the dummy gate.

S/D regions 140 and 150 are formed on exposed regions of the upper fin portion. In one embodiment, the S/D regions serve as base S/D regions 146 and 156. The base S/D regions are heavily doped with first polarity type dopants. The S/D regions are formed by implanting first polarity type dopants into the upper fin portion. The implant process is performed at a dose of about 2E15 $cm^2$. The S/D regions include a depth of about 5-20 nm and dopant concentration of about $10^{20}$ $cm^{-3}$. Other suitable depth dimensions and dopant concentration as well as dose may also be useful. An implant mask (not shown) may be employed to prevent other parts of the device from being implanted with dopants.

Raised S/D regions 148 and 158 are formed on the base S/D regions in the upper fin portion as well as on the S/D pads (not shown). The raised S/D regions are formed by selective epitaxial growth (SEG). The SEG selectively forms raised crystalline S/D region on exposed portions of the upper fin portion. The raised S/D regions have a faceted cross-section profile, due to the different surfaces of the fin structure. The height of the raised S/D regions should be below the top surface of the dummy gate. The raised S/D regions are heavily doped with first polarity type dopants. The stressors may be Si:C or Si for n-channel and SiGe for p-channel. Other suitable types of stressors may also be useful. The dopants may be incorporated into the raised S/D regions by in-situ doping or could be incorporation by implantation process. Other techniques for incorporating the dopants into the raised S/D regions may also be useful.

Referring to FIGS. $4d_1$-$4d_2$, an interlevel dielectric (ILD) layer 180 is formed on the substrate, covering the raised S/D regions, fin, dummy gate, gate hard mask and isolation layer. The ILD layer, for example, may be silicon oxide formed by CVD. Other types of ILD layer or forming techniques may also be useful. The ILD layer is planarized, forming a co-planar top surface with the dummy gate. For example, a chemical mechanical polish (CMP) is performed to planarize the ILD layer and dummy gate. Alternatively, the ILD may be planarized until it reaches the top surface of the hard mask 490. The hard mask 490 may then be removed by suitable techniques and continue with planarization process until the top surface of the ILD is about co-planar with the dummy gate.

After planarization, the exposed dummy gate is selectively removed. Removal of the dummy gate may be performed by dry etch, wet etch or a combination thereof. For example, a wet etch selective to the ILD layer and sidewall spacers may be performed. Removal of the dummy gate leaves a gate trench 439 and exposes the top surface of the hard mask 380 on the substrate.

As shown in FIGS. $4d_1$-$4d_2$, protective liners 475a-475b are formed on sidewalls of gate trench. In one embodiment, the protective liner is a silicon nitride liner. Other suitable types of materials which can be selectively etched to the isolation layer on the substrate may also be useful. Preferably, the protective liner is the same material as the hard mask 380. Other configurations of protective liners and hard masks may also be useful. The protective liner may be formed by, for example, CVD. Other techniques for forming the protective liner may also be useful. The thickness of the protective liner may be about, for example, 5-20 nm. An anisotropic etch, such as RIE, is performed to remove horizontal portions of the liner, leaving liners on spacer sidewalls and lining the sidewalls of the trench. This removes portions of the liner over the ILD layer as well as over the hard mask 380.

The isolation layer 370, in FIGS. $4d_1$-$4d_2$, is recessed below the protective liners 475a-475b. For example, a dry etch, such as RIE, is employed to recess the isolation layer and a brief wet etch is performed to expose portions of the fin. For example, the thickness $T_1$ of the isolation layer is thinned to a second thickness $T_2$. The thickness $T_2$, for example, may be about 200-400 nm. In one embodiment, the thickness $T_2$ is about 280 nm. This exposes portions 429 on sides of the fin between the protective liners and surface of the recessed isolation layer 170. A distance D between the liner and top surface of the isolation layer should be sufficient for subsequent processing to form an isolation buffer in the bottom portion of the fin. The distance D, for example, may be about 10-100 nm. In one embodiment, the distance D is about 10 nm. Other distances may also be useful.

Referring to FIGS. $4e_1$-$4e_2$, the process continues to form an isolation buffer 260 in the exposed upper bottom fin portion below the channel which is under the gate trench 439. In one embodiment, the isolation buffer includes dielectric material, such as an oxide buffer that is formed by thermal oxidation. The oxidation oxidizes exposed portions of the fin under the channel 138, forming an oxide isolation buffer. The oxide isolation buffer 260, as shown, may extend to about an outer edge of the spacers, which result it being under the S/D extension regions. The isolation buffer should be sufficiently thick to provide the desired isolation. For example, the isolation buffer should be about 10 nm thick. Other thicknesses may also be useful. To enhance oxidation, the exposed bottom fin portion under the channel may be heavily doped with dopants. For example, the exposed bottom fin portion may be heavily doped with p or n-type dopants. Other suitable types of dopants may also be used to enhance oxidation and/or for better etch selectivity. The dopant concentration of these dopants, for example, may be about 1E18-1E19 $cm^{-3}$. Other suitable dopant concentrations may also be useful. In one embodiment, the ILD layer over the S/D regions protects the bottom fin portion below the S/D regions from being oxidized as shown in FIGS. $4e_1$-$4e_2$.

In another embodiment, the isolation buffer 260 is a void in the upper bottom fin portion under the channel. To form a void, an isotropic etch, such as a wet etch, is performed. In one embodiment, the wet etch removes exposed oxidized portions of the fin under the channel as well as unexposed portions below the surface of the isolation layer to form the complete void. The wet etch, for example, may be a HF etch to remove the oxidized portions. In an alternate embodiment, to form a void, a wet etch which employs KOH, $NH_4OH$ or TMAH is performed after formation of the protective liners and recessing the isolation layer to remove exposed portions of the fin under the channel as well as unexposed portions below the surface of the isolation layer. Other types of wet etches may also be useful. The ILD, in one embodiment, protects the bottom fin portion below the S/D regions from being etched.

In yet another embodiment, the isolation buffer is a hybrid isolation buffer. The hybrid isolation buffer includes a combination of dielectric material and a plurality of voids within the dielectric material. To form a hybrid isolation buffer, an oxidation process is performed to oxidize exposed portions of the bottom fin portion under the channel and voids within the oxide buffer could be formed due to this oxidizing process, resulting in hybrid isolation buffer. Alternatively, the hybrid isolation buffer may be formed by filling the complete void as discussed in the preceding paragraph with an oxide material. A plurality of voids could be formed within the oxide material during the filling process, forming the hybrid isolation buffer. The ILD prevents the hybrid buffer from forming in the bottom fin portion below the S/D regions.

The process continues to form the transistor. The protective liners are removed. For example, to form a tri-gate structure, a wet etch selectively removes the protective liners and the hard mask 380, exposing the fin structure and sidewalls of the spacers. In an alternate embodiment, to form a double gate structure, the protective liners are removed without removing the hard mask 380. The hard mask remains in the gate trench for a double gate structure. In one embodiment, a metal gate 130 is formed on the substrate in the gate trench. Forming the metal gate includes forming a high-k gate dielectric layer 132 on the substrate. The gate dielectric layer lines the gate trench and ILD layer. The high-k gate dielectric layer, for example, may be $HfO_2$, HfSiON, $La_2O_3$, zirconium oxide or silicates thereof formed by ALD. A metal gate electrode layer 134, such as TaN or TiN, may be formed over the gate dielectric layer by ALD, CVD or PVD. A work function tuning layer may be formed in between the metal gate electrode and the high-k gate dielectric layer. Other types of gate dielectric materials, electrode materials or forming techniques may also be useful. For example, the gate dielectric may be silicon oxide and the gate electrode may be polysilicon. These layers are planarized, forming a planar top surface between the ILD, gate dielectric and gate electrode as shown in FIGS. $4f_1$-$4f_2$. The metal gate wraps around the fin structure and includes top gate and side gate regions 136 and 137. As shown, the side gate region 137, in one embodiment, includes a bottom which extends beyond the bottom of the base S/D regions 146 and 156.

Additional process may be performed to complete the device. For example, additional processes include forming contacts to the transistor. For example, contact openings are formed to the contact pads onto the exposed contact regions. Silicide contacts may be formed on exposed contact regions. Contact plugs are formed in the contact openings with the silicide contacts. Additional processes may include back end of line process to finish the manufacturing of the device, such as forming of one or more interconnect levels, final passivation, dicing, assembly, packaging and testing. Other processes are also useful. For example, other components, such as low voltage, medium voltage, and high voltage I/O devices can be formed prior to forming the interconnections.

The embodiments as described with respect to FIGS. 3a-3g and FIGS. 4a-4f include some or all advantages as described with respect to FIGS. 1a-1d and FIGS. 2a-2d. As such, these advantages will not be described or described in detail.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:
1. A method for forming a device comprising:
providing a substrate prepared with a device region;

forming a fin in the device region, the fin includes top and bottom fin portions, wherein the top fin portion serves as a body of a fin type transistor;

forming an isolation layer on the substrate, wherein the isolation layer has a top isolation surface disposed below the top fin portion;

forming at least one isolation buffer in the bottom fin portion, leaving the top fin portion crystalline, wherein the at least one isolation buffer does not extend throughout the entire length of the bottom fin portion and partially isolates the top fin portion from the substrate, wherein forming the at least one isolation buffer comprises performing an oxidation process to form at least one oxidized portion in the bottom fin portion, removing the at least one oxidized portion to form a complete void, and filling the complete void with an oxide material having a plurality of voids, wherein the at least one isolation buffer is a hybrid isolation buffer;

forming source/drain (S/D) regions in the top portions of the fin; and forming a gate wrapping around the fin, wherein the gate comprises a top gate portion on top of the fin and side gate portions extending from a top surface of the fin towards the top isolation surface, wherein the side gate portions extend below the S/D regions and are in direct contact with sidewalls of the bottom fin portion.

2. The method of claim 1 wherein forming the isolation layer comprises providing an isolation layer having an initial thickness $T_1$ and performing an etch to recess the isolation layer from the initial thickness $T_1$ to a final thickness $T_2$.

3. The method of claim 2 comprising:
forming protective liners on sidewalls of an upper fin portion over the isolation layer prior to recessing the isolation layer from $T_1$ to $T_2$, wherein forming the protective liners include a blanket deposition process to form a protective layer on the fin and isolation layer, and performing an etch to remove horizontal portions of the protective layer, leaving vertical portions of the protective layer to form the protective liners.

4. The method of claim 3 wherein forming the at least one isolation buffer comprises forming first and second isolation buffers which are separated from each other under the S/D regions.

5. The method of claim 4 wherein forming the first and second isolation buffers comprises:
recessing the isolation layer from $T_1$ to $T_2$ after forming the protective liners;
doping exposed portions of the fin in-between the protective liners and a top surface of the recessed isolation layer; and
wherein the oxidation process is performed to oxidize the exposed doped fin portions to form first and second oxide portions.

6. The method of claim 5 comprising forming a dummy gate over the substrate prior to performing the oxidation process, wherein the dummy gate protects the bottom fin portion under a channel region below the gate from being oxidized.

7. The method of claim 6 comprising:
performing an etch to remove the first and second oxide portions to form first and second complete voids below the S/D regions; and
filling the complete voids with the oxide material having the plurality of voids to form the first and second isolation buffers.

8. The method of claim 6 comprising:
removing the protective liners after forming the isolation buffers;
forming sidewall spacers on exposed sidewalls of the dummy gate; and
forming raised S/D regions on the S/D regions.

9. The method of claim 8 comprising:
forming an interlevel dielectric (ILD) layer on the substrate covering the fin, dummy gate and isolation layer;
performing a planarization process to form a top ILD surface which is about co-planar with the top surface of the dummy gate; and
removing the dummy gate after the planarization process to form the gate.

10. The method of claim 3 wherein the at least one isolation buffer is disposed under a channel region below the gate.

11. The method of claim 10 comprising:
forming a dummy gate over the substrate prior to forming the gate;
forming sidewall spacers on sidewalls of the dummy gate; and
forming raised S/D regions on the S/D regions after forming the sidewall spacers.

12. The method of claim 11 comprising:
forming an interlevel dielectric (ILD) layer on the substrate covering the fin, dummy gate and isolation layer;
performing a planarization process to form a top ILD surface which is about co-planar with top surface of the dummy gate; and
removing the dummy gate after the planarization process to form a gate trench and expose the sidewall spacers.

13. The method of claim 12 wherein the protective liners are formed in the gate trench over the exposed sidewall spacers and the isolation buffer under the channel region is formed by:
doping an exposed portion of the fin in-between the protective liners and the top isolation surface of the recessed isolation layer; and
wherein the oxidation process is performed to oxidize the exposed doped fin portion to form an oxide portion, wherein the ILD layer protects the bottom fin portion below the S/D regions from being oxidized.

14. The method of claim 13 comprising:
performing an etch to remove the oxide portion to form the complete void below the channel region; and
filling the complete void with the oxide material having the plurality of voids to form the isolation buffer.

15. A method for forming a device comprising:
providing a substrate prepared with a device region;
forming a fin structure in the device region, the fin structure includes top and bottom fin portions, wherein the top fin portion serves as a body of a fin type transistor;
forming an isolation layer on the substrate, wherein the isolation layer has a top isolation surface disposed below the top fin portion;
forming at least one isolation segment in the bottom fin portion and leaving the top fin portion crystalline, wherein forming the at least one isolation segment comprises
performing an oxidation process to form at least one oxidized portion in the bottom fin portion,
removing the at least one oxidized portion to form a complete void, and
filling the complete void with an oxide material having a plurality of voids, wherein the at least one isolation segment is a hybrid isolation segment, the at least one isolation segment partially isolates the top fin portion from the substrate;

forming first and second source/drain (S/D) regions of the fin type transistor, wherein each of the S/D regions include a base S/D portion disposed within the top fin portion and a raised S/D portion disposed on the base S/D portion; and forming a gate wrapping around the fin structure, wherein the gate comprises a top gate portion on top of the fin and side gate portions extending from a top surface of the fin towards the top isolation surface, wherein the side gate portions extend below the S/D regions and in direct contact with sidewalls of the bottom fin portion.

16. The method of claim 15 wherein the bottom fin portion includes at least one crystalline segment conductively coupling the top fin portion to the substrate.

17. The method of claim 16 wherein the at least one isolation segment comprises first and second isolation segments which are separated from each other, wherein the first and second isolation segments isolate the first and second S/D regions from the substrate while the at least one crystalline segment conductively couples a channel region of the fin type transistor to the substrate.

18. The method of claim 16 wherein the at least one isolation segment isolates a channel region of the fin type transistor from the substrate while the at least one crystalline segment comprises first and second crystalline segments coupling the first and second S/D regions to the substrate.

19. A method for forming a device comprising:
providing a substrate prepared with a device region;
forming a fin in the device region, the fin includes top and bottom portions;
forming a dummy gate over the substrate;
forming an isolation layer on the substrate, wherein the isolation layer has a top isolation surface disposed below the top fin portion, wherein forming the isolation layer comprises providing an isolation layer having an initial thickness $T_1$ and performing an etch to recess the isolation layer from the initial thickness $T_1$ to a final thickness $T_2$;
forming protective liners on sidewalls of an upper fin portion over the isolation layer prior to recessing the isolation layer from $T_1$ to $T_2$, wherein forming the protective liners include a blanket deposition process to form a protective layer on the fin and isolation layer, and performing an etch to remove horizontal portions of the protective layer, leaving vertical portions of the protective layer to form the protective liners;
forming at least one isolation buffer in the bottom fin portion, leaving the top fin portion crystalline, wherein the at least one isolation buffer does not extend throughout the entire length of the bottom fin portion and partially isolates the top fin portion from the substrate, the top fin portion serves as a body of a fin type transistor, wherein forming the at least one isolation buffer comprises forming first and second isolation buffers which are separated from each other under the S/D regions, wherein forming the first and second isolation buffers comprises
recessing the isolation layer from $T_1$ to $T_2$ after forming the protective liners,
doping exposed portions of the fin in-between the protective liners and a top surface of the recessed isolation layer, and
performing an oxidation process to the exposed doped fin portions to form first and second oxide portions, wherein the dummy gate protects the bottom fin portion under a channel region below the gate from being oxidized;
performing an etch to remove the first and second oxide portions to form first and second complete voids below the S/D regions;
filling the complete voids with an oxide material having a plurality of voids to form the first and second isolation buffers, wherein the isolation buffers are hybrid isolation buffers;
forming source/drain (S/D) regions in the top portions of the fin; and
forming a gate wrapping around the fin, wherein the gate comprises a top gate portion on top of the fin and side gate portions extending from a top surface of the fin towards the top isolation surface, wherein the side gate portions extend below the S/D regions and in direct contact with sidewalls of the bottom fin portion.

* * * * *